(12) United States Patent
Sung et al.

(10) Patent No.: US 11,177,449 B2
(45) Date of Patent: Nov. 16, 2021

(54) P-TYPE SEMICONDUCTOR LAYER, P-TYPE MULTILEVEL ELEMENT, AND MANUFACTURING METHOD FOR THE ELEMENT

(71) Applicant: INDUSTRY-UNIVERSITY COOPERATION FOUNDATION HANYANG UNIVERSITY, Seoul (KR)

(72) Inventors: Myung Mo Sung, Seoul (KR); Jin Seon Park, Seoul (KR); Hongbum Kim, Seoul (KR); Hongro Yun, Wonju-si (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/711,710

(22) Filed: Dec. 12, 2019

(65) Prior Publication Data
US 2020/0194699 A1 Jun. 18, 2020

(30) Foreign Application Priority Data

Dec. 12, 2018 (KR) .................. 10-2018-0160164
Dec. 5, 2019 (KR) .................. 10-2019-0160562

(51) Int. Cl.
*H01L 51/05* (2006.01)
*H01L 51/10* (2006.01)
*H01L 51/00* (2006.01)

(52) U.S. Cl.
CPC ...... *H01L 51/0562* (2013.01); *H01L 51/0002* (2013.01); *H01L 51/0545* (2013.01); *H01L 51/105* (2013.01); *H01L 2251/303* (2013.01)

(58) Field of Classification Search
CPC .............. H01L 51/0562; H01L 51/105; H01L 51/0545; H01L 51/0002; H01L 29/78696
See application file for complete search history.

(56) References Cited

U.S. PATENT DOCUMENTS

2012/0138922 A1 6/2012 Yamazaki et al.
2017/0179263 A1* 6/2017 Pourtois ................ H01L 29/778
(Continued)

FOREIGN PATENT DOCUMENTS

JP 7-161965 A 6/1995
KR 10-2008-0083126 A 9/2008
(Continued)

*Primary Examiner* — Anthony Ho
(74) *Attorney, Agent, or Firm* — Sughrue Mion, PLLC

(57) ABSTRACT

Provided are P-type semiconductor layer, P-type multilevel element, and manufacturing method for the element. The P-type multilevel element comprises a gate electrode, an active structure overlapping the gate electrode, a gate insulating layer disposed between the gate electrode and the active structure, and source and drain electrodes electrically connected to both ends of the active structure, respectively. The active structure has a first P-type active layer, a second P-type active layer, and a barrier layer disposed between the first P-type active layer and the second P-type active layer. A threshold voltage for forming a channel in the first P-type active layer and a threshold voltage for forming a channel in the second P-type active layer have different values.

23 Claims, 15 Drawing Sheets

(56) References Cited

U.S. PATENT DOCUMENTS

2018/0190824 A1 7/2018 Bae et al.
2018/0337288 A1* 11/2018 Shin .................... G09G 3/2007

FOREIGN PATENT DOCUMENTS

| KR | 10-2014-0118691 A | 10/2014 |
| KR | 10-2018-0078837 A | 7/2018 |
| KR | 10-2018-0118541 A | 10/2018 |
| WO | 2007/064474 A1 | 6/2007 |
| WO | 2014/157821 A1 | 10/2014 |

* cited by examiner

Resonant Hybridization

Region I (R1)

Region II (R2)

Region III (R3)

| Sn | P | Sn | P | Sn | P | Sn | P |
|---|---|---|---|---|---|---|---|
| 5s | 40s | 5s | 40s | 5s | 40s | 5s | 40s |
| 50 mTorr | | 50 mTorr | | 50 mTorr | | 50 mTorr | |
| H₂O | P | H₂O | P | H₂O | P | H₂O | P |
| 2s | 40s | 2s | 40s | 2s | 40s | 2s | 40s |
| 300 mTorr | | 300 mTorr | | 300 mTorr | | 300 mTorr | |

P-TYPE SEMICONDUCTOR LAYER, P-TYPE MULTILEVEL ELEMENT, AND MANUFACTURING METHOD FOR THE ELEMENT

CLAIM FOR PRIORITY

This application claims priority to Korean Patent Applications No. 2018-0160164 filed on Dec. 12, 2018 and No. 2019-0160562 filed on Dec. 5, 2019 in the Korean Intellectual Property Office (KIPO), the entire contents of which are hereby incorporated by reference.

BACKGROUND

1. Technical Field

Example embodiments of the present invention relates to a semiconductor layer and a semiconductor device having the same, and more specifically to a multilevel element.

2. Related Art

In recent years, with the development of smart device and artificial intelligence computer technologies, demands for higher performance devices having high performance and multifunctionality have rapidly increased.

However, the binary element fabrication technology that has lead the existing semiconductor industry is expected to reach the limit in technical, economic and principal terms due to continuous ultra-miniaturization and high integration. In other words, development methods based on the down-scaling of conventional Metal-Oxide—Semiconductor Field Effect Transistors (MOSFETs) have difficulties in the down-scaling technology itself, approaches based on down-scaling are considered to have a fundamental limitation.

To overcome this limitation, studies on multilevel elements have been conducted. Multilevel elements that have been previously studied include single-electron transistors (SETs) and resonant-tunneling transistors (RTTs). In the case of single-electron transistors (SETs) and resonant-tunneling transistors (RTTs), multilevel characteristics are mainly observed only at a very low temperature, complicated fabrication processes are required, and integration for circuit implementation is difficult, which makes it difficult to realize the technology.

SUMMARY

Example embodiments of the present invention provide a P-type semiconductor film, a multilevel element including the same, and a method of manufacturing the multilevel element, which provide excellent multilevel characteristics.

Example embodiments of the present invention provide a P-type multilevel element. The P-type multilevel element comprises a gate electrode, an active structure overlapping the gate electrode, a gate insulating layer disposed between the gate electrode and the active structure, and source and drain electrodes electrically connected to both ends of the active structure, respectively. The active structure has a first P-type active layer, a second P-type active layer, and a barrier layer disposed between the first P-type active layer and the second P-type active layer. A threshold voltage for forming a channel in the first P-type active layer and a threshold voltage for forming a channel in the second P-type active layer have different values.

The first P-type active layer and the second P-type active layer may be each independently a metal oxide semiconductor layer, a metal sulfide semiconductor layer, or a metal selenide semiconductor layer. The first P-type active layer and the second P-type active layer may be each independently a copper (I) oxide layer, a tin (II) oxide layer, or a nickel (II) oxide layer. At least one of the first P-type active layer and the second P-type active layer may have a thickness of several to several tens of nm. At least one of the first P-type active layer and the second P-type active layer may have a plurality of crystal grains irregularly dispersed in an amorphous matrix. The crystal grains may have an average diameter of several nm.

The current flowing in the first P-type active layer may be saturated after the channel is formed in the first P-type active layer and before the channel is formed in the second P-type active layer. A gate voltage applied to the gate electrode may have a first gate voltage range, a second gate voltage range, and a third gate voltage range, and a ratio of the current flowing through the active structure to the gate voltage may have a first slope in the first gate voltage range, a second slope lower than the first slope in the second gate voltage range, and a third slope greater than the second slope in the third gate voltage range. The second slope may be 0.

The barrier layer may be a first barrier layer, and the active structure may further include a second barrier layer disposed between the gate insulating layer and the first P-type active layer, and the first P-type active layer interposed between the first barrier layer and the second barrier layer may form a quantum well.

The barrier layer may include at least one organic monolayer. The barrier layer may comprise two or more organic monolayers, and a metal atomic layer may be disposed between the adjacent organic monolayers.

At least one layer of the first P-type active layer and the second P-type active layer may include an amorphous region and a plurality of crystalline regions surrounded by the amorphous region, and some of the energy states of the amorphous region and some of the energy states of the crystalline region may be matched to provide a quantized conducting state at energy level lower than a mobility edge in a valence band.

Example embodiments of the present invention provide a P-type semiconductor layer which exhibits a first energy range providing extended states at a first number of state and a second energy range providing extended states at a second number of state at an energy level lower than the mobility edge in the valence band. The first energy range and the second energy range do not overlap each other.

A localized state may be provided between the first energy range and the second energy range. In the localized state, a density of state may be 0. A first density of state curve in the first energy range and a second density of state curve in the second energy range may be discontinuous with each other. A lowest energy value of the first energy range may be greater than a maximum energy value of the second energy range.

Example embodiments of the present invention provide a P-type multilevel element comprising a step for forming a gate electrode, a step for forming an active structure, a step for forming a gate insulating layer, and a step for forming a source/drain electrodes electrically connected to both ends of the active structure. The step for forming the active structure includes a step for forming a first P-type active layer, a step for forming a barrier layer on the first P-type active layer, and a step for forming a second P-type active layer on the barrier layer. At least one of steps for forming the first type P-type active layer and the second P-type active layer includes performing a plurality of unit cycles. Each of unit cycles includes introducing a substrate into a chamber having a gas inlet and a gas outlet, a metal precursor pressurized dosing step in which a metal precursor is supplied while the gas outlet of the chamber is closed to increase a reaction pressure in the chamber to adsorb the metal precursor onto a surface of the substrate, a metal precursor purge step of purging the chamber after the metal precursor pressurized dosing step, a reaction gas supplying step of supplying a reaction gas into the chamber after the metal precursor purge step to react with the metal precursor adsorbed on the surface of the substrate, and a reaction gas purge step of purging the chamber after the reaction gas supplying step.

The metal precursor pressurized dosing step and the metal precursor purge step may constitute a metal precursor subcycle, and the metal precursor subcycle may be performed multiple times before the reaction gas supplying step.

The reaction gas supplying step may be a reaction gas pressurized dosing step including supplying the reaction gas into the chamber while the gas outlet of the chamber is closed to increase a pressure in the chamber. The reaction gas pressurized dosing step and the reaction gas purge step may constitute an reaction gas subcycle, and the unit cycle may include performing the reaction gas subcycle several times in succession.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1:
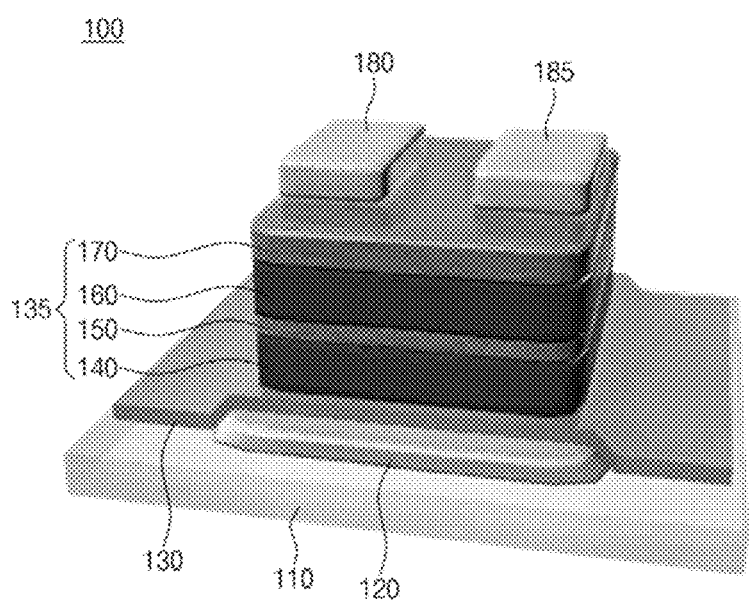
FIG. 1 is a perspective view illustrating a multilevel device according to an exemplary embodiment of the present invention.

Hereinafter, exemplary embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the specification, when any element is referred to as being "on" other element, it means that the element may be formed directly on the other element, or that a third element may be interposed therebetween. In the drawings, the thicknesses of layers and regions may have been exaggerated in order to clearly illustrate features of the embodiments.

In addition, although the terms 'first', 'second', "third" etc. may be used to describe various elements in various embodiments of the present invention, these elements should not be limited by these terms. These terms are only used to distinguish any element from other element. Thus, a first element mentioned in any one embodiment may be termed a second element in other embodiment. Each embodiment described and exemplified herein also includes a complementary embodiment thereof. As used herein, the term "and/or" is meant to include at least one of components listed before and after the term "and/or".

In the specification, singular expressions include plural expressions unless specified otherwise in the context thereof. In addition, the terms "comprise", "have", etc., are intended to denote the existence of mentioned characteristics, numbers, steps, elements, components, or combinations thereof, but do not exclude the probability of existence or addition of one or more other characteristics, numbers, steps, elements, components, or combinations thereof. As used herein, the term "connecting" includes connecting a plurality of elements both directly and indirectly.

Furthermore, in the following description, detailed description of related known functions and configurations will be omitted when it may unnecessarily obscure the subject matter of the present invention.

In the specification, a "multilevel element" does not mean a conventional element having the binary states (0 and 1), but may mean an element having ternary or higher states (0, 1 and 2, or 0, 1 and 2 and greater than 2). Namely, a conventional element may have only two states (on and off), whereas the multilevel element according to one embodiment of the present invention may have a third state in addition to the "on" and "off" states.

FIG. 1 is a perspective view illustrating a multilevel device according to an exemplary embodiment of the present invention.

Referring to FIG. 1, a multilevel device 100 may be formed on a substrate 110.

The substrate 110 may be a semiconductor substrate, a metal substrate, a glass substrate, or a flexible substrate. The semiconductor substrate may be a silicon substrate. The flexible substrate may be a polymer substrate, for example, polyethylene terephthalate (PET) or polyimide (PI) substrate. Elements for operating circuits or the like may be formed on the substrate 110, or a protective layer (not shown) such as an insulating layer covering the substrate or the element may be formed. The surface of the substrate 110 may be cleaned and surface treated if necessary.

The gate electrode 120 extending in one direction may be formed on the substrate 110. The gate electrode 120 may be formed using Al, Cr, Cu, Ta, Ti, Mo, W, or an alloy thereof. A gate insulating layer 130 may be formed on the gate electrode 120. The gate insulating layer 130 may be a silicon oxide layer, a silicon oxynitride layer, an aluminum oxide layer, an aluminum oxynitride layer, a hafnium oxide layer, a hafnium oxynitride layer, or a composite layer thereof. The gate insulating layer 130 may be formed using an atomic layer deposition method, and may be, for example, an aluminum oxide layer. The thickness of the gate insulating layer 130 may be in a range that can tolerate dielectric breakdown in the operating range of the gate voltage. For example, when the operating range of the gate voltage is low, the thickness of the gate insulating layer 130 may be thinner than when the operating range of the gate voltage is high.

An active structure 135 overlapping the gate electrode 120 may be formed on the gate insulating layer 130. A source electrode 180 and a drain electrode 185 may be formed on both ends of the active structure 135. The source electrode 180 and the drain electrode 185 may include at least one of aluminum (Al), neodymium (Nd), silver (Ag), chromium (Cr), titanium (Ti), tantalum (Ta), and molybdenum (Mo), or an alloy containing one of them, or a metal oxide conductive layer, for example, indium tin oxide (ITO).

The active structure 135 may include at least one P-type active layer and at least one barrier layer. Specifically, the active structure 135 may include two or more P-type active layers and a barrier layer disposed between the adjacent P-type active layers. As an example, the active structure 135 may include a first P-type active layer 150, a barrier layer 160, and a second P-type active layer 170 that are sequentially stacked. A barrier layer 140 may be further provided below the first P-type active layer 150. In this case, the active structure 135 may include the first barrier layer 140, the first P-type active layer 150, the second barrier layer 160, and the second P-type active layer 170 which are sequentially stacked. As another example, the active structure 135 may include a first P-type active layer 150, a first barrier layer 160, a second P-type active layer 170, a second barrier layer (not shown), and a third P-type active layer (not shown) that are sequentially stacked. As the distance from the gate electrode 120 increases, the thickness of the P-type active layer may increase. Alternatively, the thickness of the P-type active layer may be constant regardless of the distance from the gate electrode 120.

The barrier layers 140 and 160 may be insulating layers, and may have a larger band gap than the P-type active layers 150 and 170. For example, each of the P-type active layers 150 and 170 may have a band gap of 2 to 4 eV regardless of each other, and the barrier layer may have a band gap of 6 to 8 eV. The barrier layers 140 and 160 may form an adjacent interface with the P-type active layer 150, and the P-type active layer 150 interposed between the first barrier layer 140 and the second barrier layer 160 may form a quantum well structure. In another example, even if the first barrier layer 140 under the first P-type active layer 150 is omitted, the first P-type active layer 150 interposed between the gate insulating layer 130 and the second barrier layer 160 may form a quantum well structure.

At least one of the barrier layers 140 and 160 may be an organic material layer, an inorganic material layer, or an organic/inorganic composite layer. The barrier layer 160 may protect the P-type active layer 150. For example, the barrier layer 160 may minimize inadvertent doping in the first P-type active layer 150 or penetration of a precursor into the first P-type active layer 150 during deposition of another layer over the first P-type active layer 150. In example embodiments, the P-type active layer and the barrier layer adjacent to the P-type active layer may form a super lattice structure. Stability can be improved by the super lattice structure.

The P-type active layers 150 and 170 may be P-type semiconductor layers, specifically, P-type metal oxide semiconductor layers, P-type metal sulfide semiconductor layers, or P-type metal selenide semiconductor layers. The P-type metal oxide semiconductor may be copper (I) oxide semiconductor ($Cu_2O$), tin (II) oxide semiconductor (SnO), or nickel (II) oxide semiconductor (NiO). As an example, the P-type metal oxide semiconductor may be SnO. The P-type metal sulfide semiconductor may be $Cu_2S$. The P-type metal selenide semiconductor may be SnSe.

Each of the P-type active layers 150 and 170 may have a thickness of several nanometers to several tens of nanometers, for example, greater than 1.5 nm and less than or equal to 50 nm. In this case, each of the P-type active layers 150 and 170 may be quantized in the thickness direction. For example, each of the P-type active layers 150 and 170 may have a thickness of 2 to 40 nm, 4 to 30 nm, and specifically 5 to 20 nm.

A detailed description of the P-type active layer and a method of manufacturing the barrier layer and the P-type active layer will be described later.

In FIG. 1, as an example of the thin film transistor, a bottom gate-top contact type, that is, a bottom gate staggered thin film transistor is illustrated, but is not limited thereto. The present invention is also applicable to a thin film transistor of a bottom gate-bottom contact type (bottom gate coplanar type), a top gate-bottom contact type (top gate staggered type), or a top gate-top contact type (top gate coplanar type). However, the staggered type thin film transistor in which the gate electrode 120 is provided on the upper surface or the lower surface of the active structure 135, and the source and drain electrodes 180 and 185 are disposed on a surface of the active structure 135 opposite to the surface adjacent to the gate electrode 120 may be preferable.

Figure 2A:
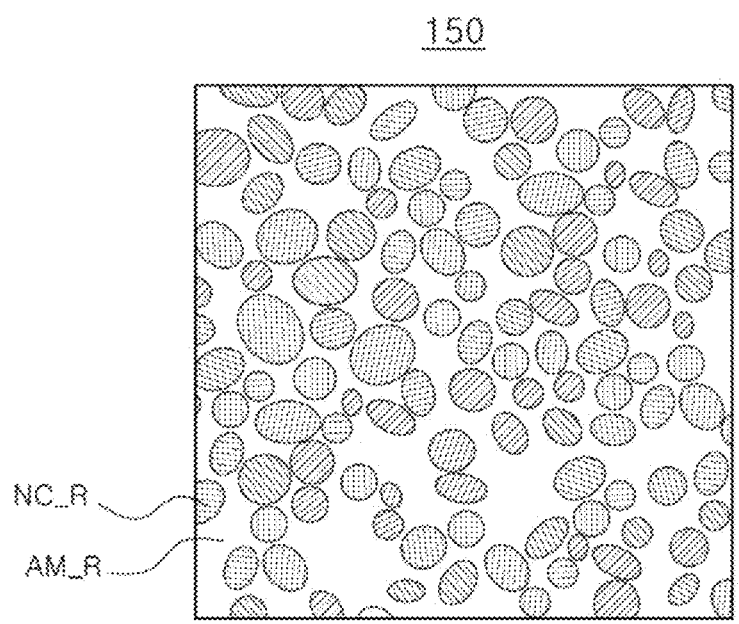
FIGS. 2A and 2B are a plan view and a cross-sectional view illustrating a P-type active layer according to an embodiment of the present invention, respectively.
Figure 2B:
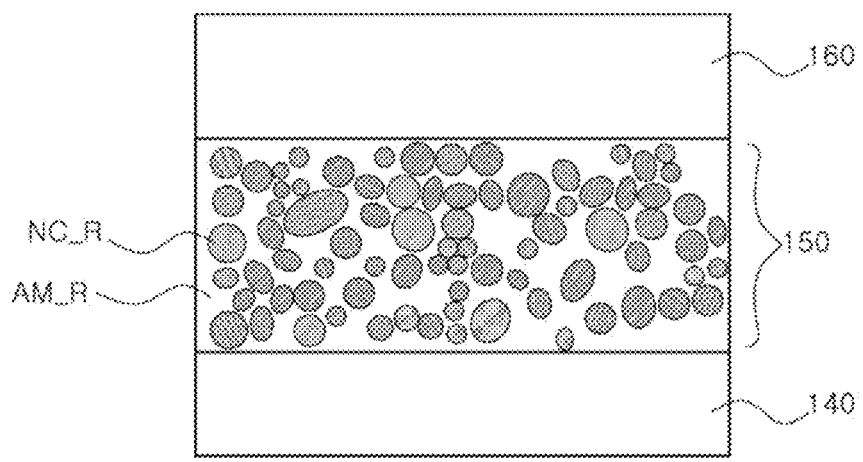

FIGS. 2A and 2B are a plan view and a cross-sectional view illustrating a P-type active layer according to an embodiment of the present invention, respectively.

Referring to FIGS. 2A and 2B, at least one of the first and second P-type active layers 150 and 170 of FIG. 1 may be a layer including an amorphous region or an amorphous matrix AM_R and a plurality of crystal grains or crystalline regions NC_R surrounded by the amorphous region AM_R. In other words, in the active layer, the plurality of crystalline regions NC_R, each in an island shape, may be irregularly distributed in the amorphous matrix AM_R. The crystalline region NC_R may be approximately in the form of a sphere. The amorphous region or the amorphous matrix AM_R and the crystalline region NC_R are the same material but different in an atomic arrangement. The amorphous region AM_R and the crystalline region NC_R are both P-type metal oxide semiconductors, for example, copper (I) oxide ($Cu_2O$), tin (II) oxide (SnO), or nickel (II) oxide (NiO).

Each of the crystalline regions NC_R may be in a nano size and may have a quantum confinement effect. Specifically, the crystalline region NC_R may have a size of several nm, for example, a diameter of 10 nm or less, for example, an average diameter of 0.5 to 8 nm, 0.8 to 5 nm, and 2 to 3 nm. In addition, the average distance between the crystalline regions NC_R may also be several nm. The crystalline region NC_R may be called a nanocrystal, and may provide a quantum confinement effect in the in-plane X-axis and Y-axis directions and in a thickness direction, that is, in the Z-axis direction. In other words, the crystalline region NC_R and, further, the P-type active layer 150 and 170, can provide the quantum confinement effect in a triaxial direction.

The crystalline regions NC_R may be arranged in a single layer or stacked in a plurality of layers in the thickness direction of the active layer 150.

Figure 3:
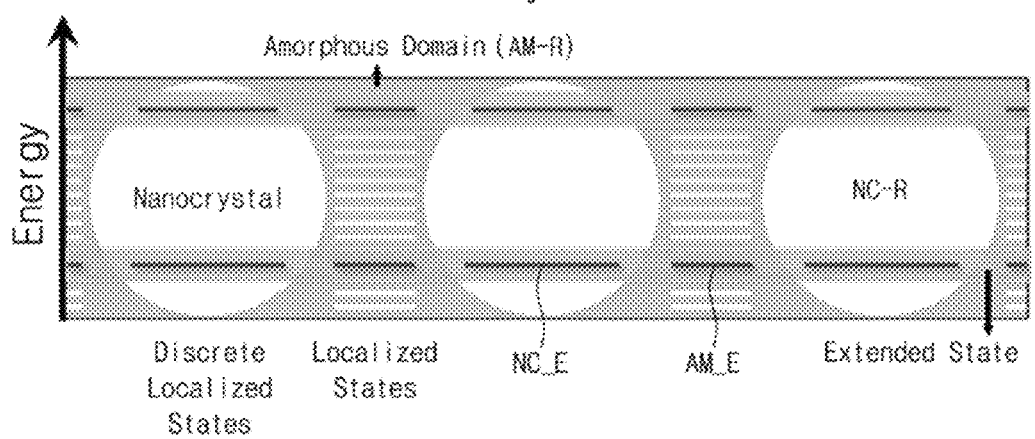
FIG. 3 is a schematic diagram illustrating an energy state of a P-type active layer according to an embodiment of the present invention.
Figure 4:
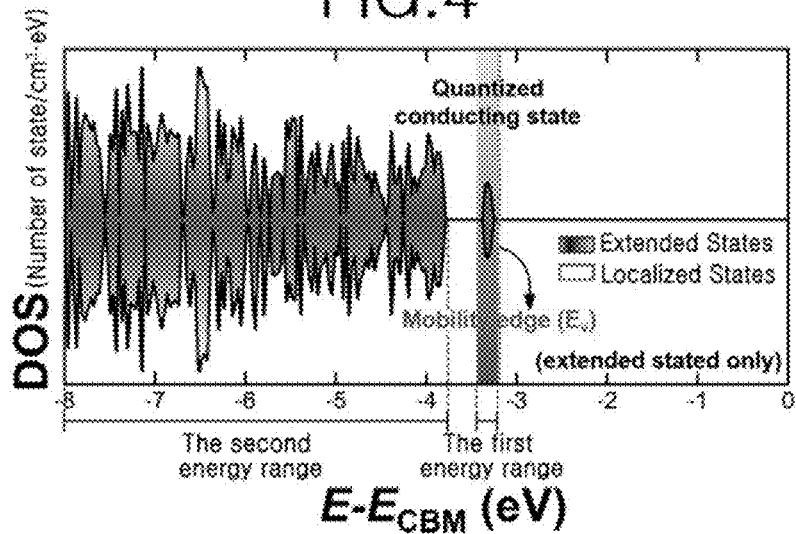
FIG. 4 is a schematic diagram illustrating a density of state (DOS) of a P-type active layer according to an embodiment of the present invention.

FIG. 3 is a schematic diagram illustrating an energy state of a P-type active layer according to an embodiment of the present invention, and FIG. 4 is a schematic diagram illustrating a density of state (DOS) of a P-type active layer according to an embodiment of the present invention. In particular, FIG. 4 is a DOS simulation results, using a program called Vienna ab initio simulation (VASP), obtained by calculating DOS of the active layer using the PBE (Perdew-Burke-Ernzerhof) exchange-correlation functional and PAW (projector-augmented wave) pseudopotentials.

Referring to FIG. 3, the amorphous region AM_R in the P-type active layer may have a number of localized states. Alternatively, the crystalline region NC_R in the P-type active layer may have a smaller number of discrete localized states than the localized states of the amorphous region AM_R. In this case, there may be resonant energy matching between a specific energy state AM_E among the localized energy states of the amorphous region AM_R and a specific energy state NC_E among the localized energy states of the crystalline regions NC_R.

Hybridization caused by the resonant energy matching may provide quantized conducting states. The quantized conducting states may provide discrete conductance levels and allow limited current flow. The quantized conducting states will now be described in more detail with reference to FIG. 4.

Referring to FIG. 4, a change in density of state (DOS) according to energy is shown.

The P-type active layer according to the exemplary embodiment of the present invention may have a valence band and a conduction band (not shown). However, as the P-type active layer includes the plurality of crystal grains or the crystalline regions NC_R surrounded by the amorphous region AM_R, as described with reference to FIG. 3, the following unique state density distribution may be obtained.

In the P-type active layer, the valence band may be divided into extended (delocalized) and localized states by a mobility edge (Ev), and the conduction band may also be divided into extended (delocalized) and localized states by a mobility edge (Ec) (not shown). In addition, the P-type active layer may have a first energy range and a second energy range that are discrete or do not overlap each other below the mobility edge Ev in the valence band.

In the first energy range, the extended states may be provided in a first number [number of states/$cm^3$], and in the second energy range, the extended states may be provided in a second number [number of states/$cm^3$]. The first energy range may be disposed closer to the mobility edge Ev than the second energy range. A localized state can be provided between the first energy range and the second energy range. In the localized state, density of state may be zero. A first density of state curve indicating a change in density of state [number of state/$cm^3 \cdot eV$] in the first energy range and a second density of state curve indicating a change in density of state [number of state/$cm^3 \cdot eV$] in the second energy range may be non-overlapping with each other. The first density of state curve may have a normal distribution. The lowest energy value of the first energy range may be greater than the maximum energy value of the second energy range.

The first number of states [number of state/$cm^3$] may be less than the second number of states [number of state/$cm^3$], and the maximum density of state [number of state/$cm^3 \cdot eV$] in the first energy range may be less than the maximum density of state [number of state/$cm^3 \cdot eV$] in the second energy range.

As described with reference to FIG. 3, in the P-type active layer, the energy level of the localized state of the amorphous region AM_R and the energy level of the localized state of the crystalline region NC_R may be matched at the energy level lower than the mobility edge Ev. The conduction state in the first energy range having the first number of states [number of state/$cm^3$] at an energy level lower than the mobility edge Ev may be defined as a quantized extended state or quantized conducting state, which can limit the carrier density flowing through this state.

In addition, the density of state may be zero between the first energy range and the second energy range. This may mean that the crystalline region NC_R of the P-type active layer does not have an energy state between the first energy range and the second energy range. Accordingly, there is no resonance energy matching between the crystalline region NC_R and the amorphous region AM_R in an energy range between the first energy range and the second energy range.

Since the crystalline region NC_R has a triaxial quantum confinement effect, the curve defined by the density of state [number of state/$cm^3 \cdot eV$] in the first energy range may have a very limited area. This may mean that a very limited carrier may exist in the first energy range having the first number of states (number of state/$cm^3$), that is, a quantized extended state or a quantized conducting state.

On the other hand, conventional P-type semiconductor layers containing only crystalline regions or P-type semiconductor layers containing only amorphous regions do not have a quantized extended state or quantized conducting state at energy level lower than the mobility edge Ev.

Figure 5:
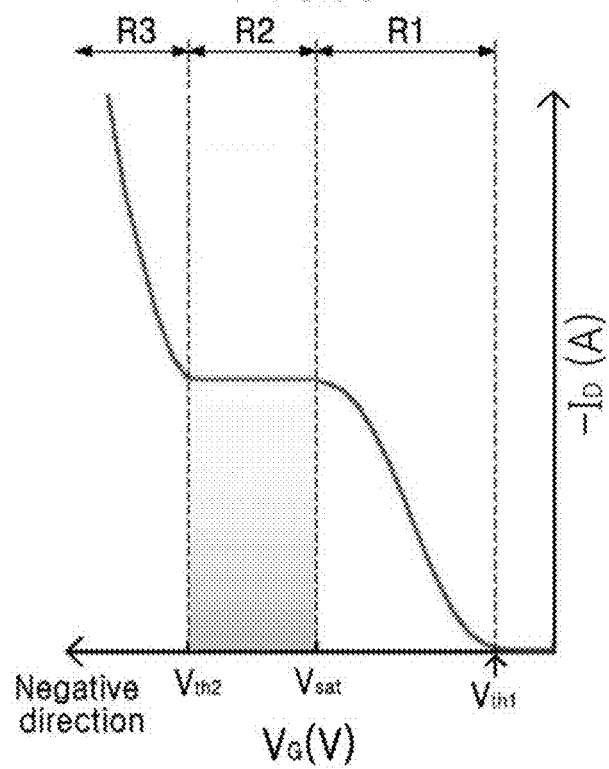
FIG. 5 is a graph illustrating transfer characteristics of the multilevel device described with reference to FIG. 1.

FIG. 5 is a graph illustrating transfer characteristics of the multilevel device described with reference to FIG. 1. FIGS. 6A, 7A, 8A, and 9A are cross-sectional views illustrating characteristics of operation steps of the multilevel device described with reference to FIG. 1. FIGS. 6B, 7B, 8B, and 9B are schematic diagrams illustrating band diagrams of operation steps of the multilevel device described with reference to FIG. 1. Reference is made to the above-described parts except for the following.

Figure 6A:
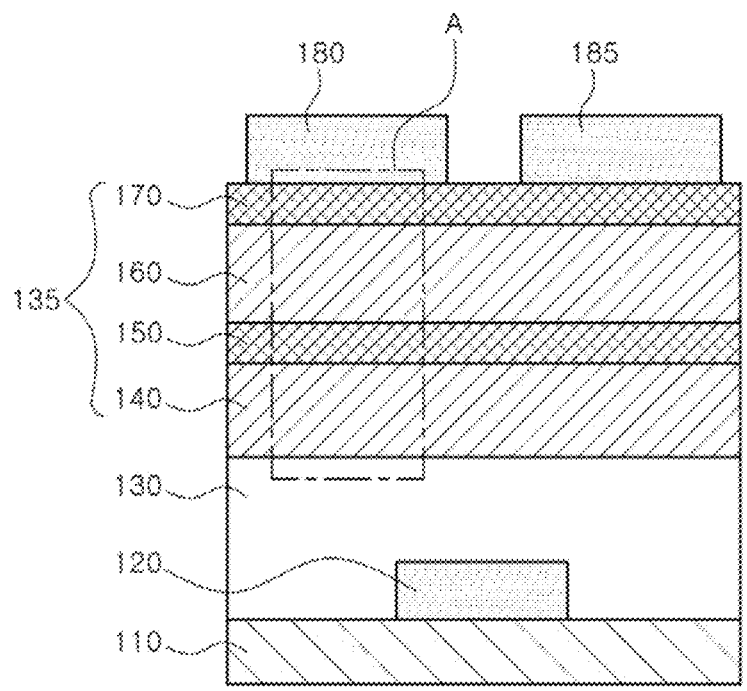
FIGS. 6A, 7A, 8A, and 9A are cross-sectional views illustrating characteristics of operation steps of the multilevel device described with reference to FIG. 1.
Figure 6B:
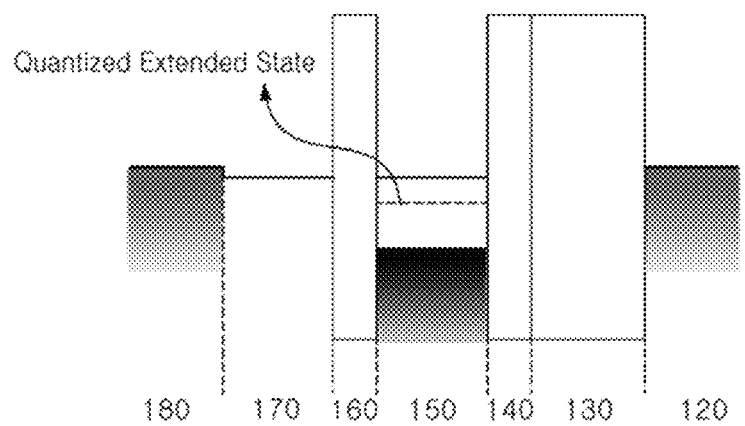
FIGS. 6B, 7B, 8B, and 9B are schematic diagrams illustrating band diagrams of operation steps of the multilevel device described with reference to FIG. 1.

Referring to FIGS. 6A and 6B, the gate electrode 120, the source electrode 180, and the drain electrode 185 are all in a floating state.

The barrier layers 140 and 160 are insulating layers, and may be layers having a larger band gap than the P-type active layers 150 and 170. For example, each of the P-type active layers 150 and 170 may have a band gap of 2 to 4 eV regardless of each other, and the barrier layers 140 and 160 may have a band gap of 6 to 8 eV. The barrier layers 140 and 160 may form an adjacent interface with the P-type active layer 150, so that the P-type active layer 150 may form a quantum well. In addition, at least one of the P-type active layers 150 and 170 may have a quantized extended state or a quantized conducting state at the energy level below the mobility edge Ev in the valence band provided by resonance energy matching of the crystalline region NC_R and amorphous regions AM_R as described with reference to FIGS. 2A, 2B, 3, 4A, and 4B.

Figure 7A:
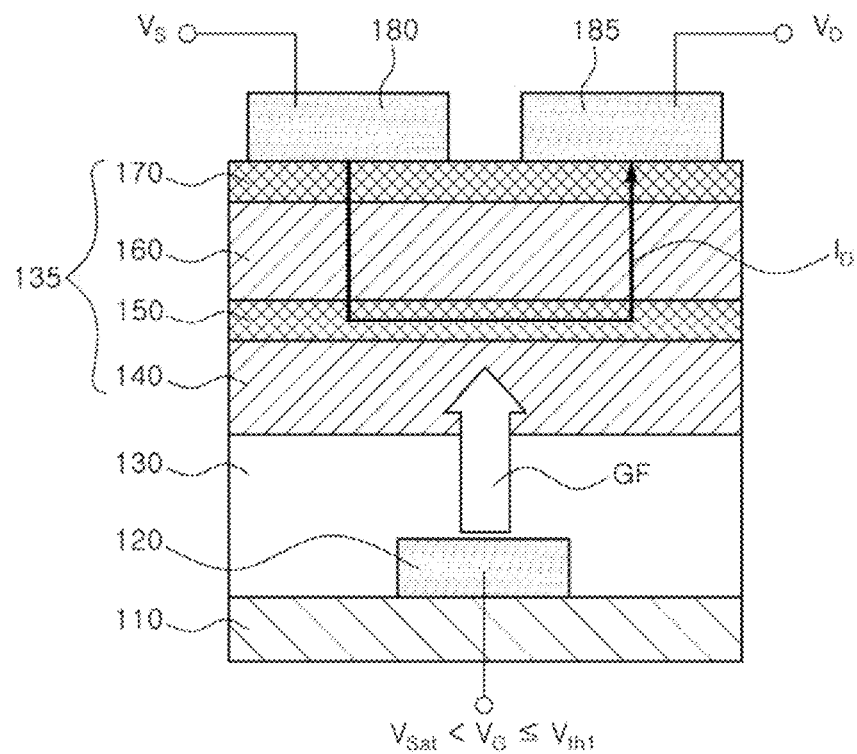
Figure 7B:
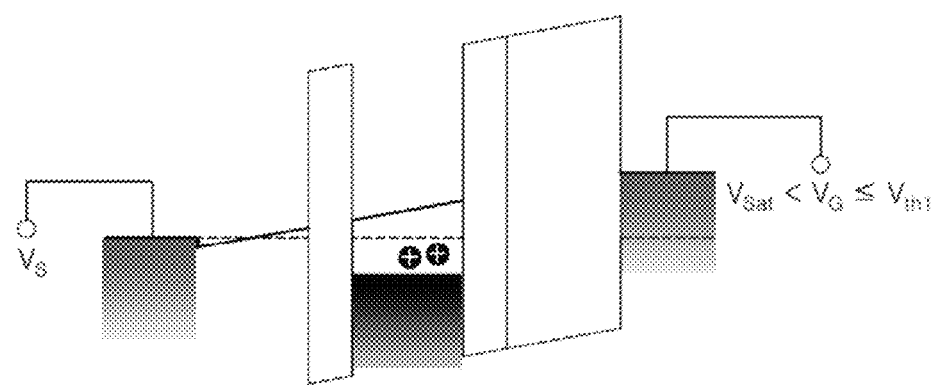
Figure 8A:
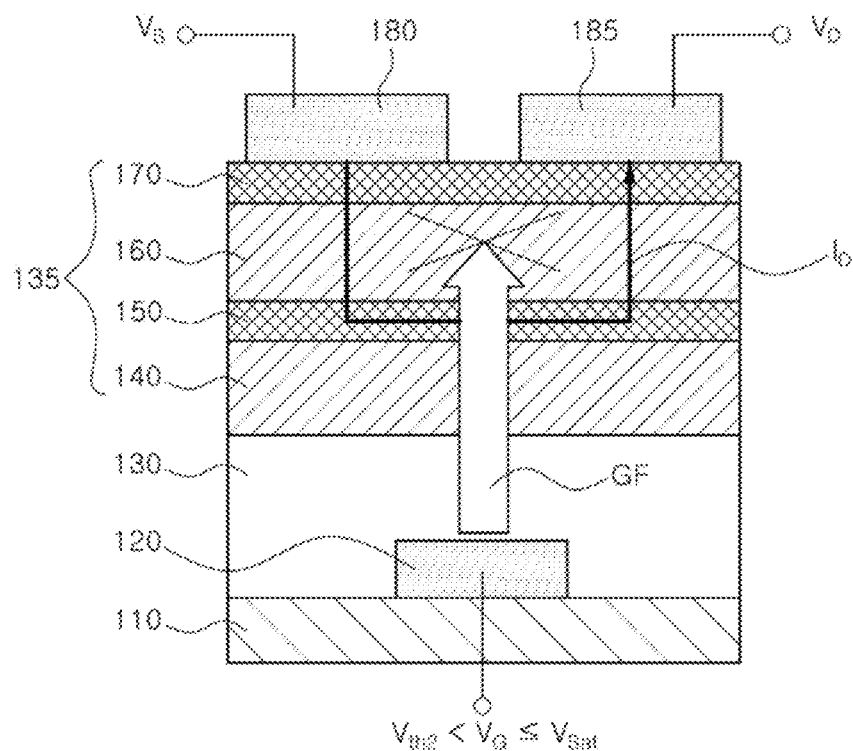
Figure 8B:
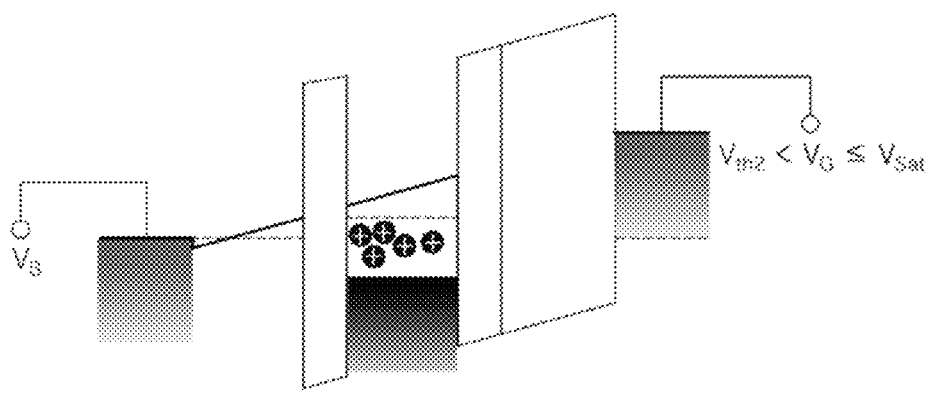

FIGS. 5, 7A, and 7B, when the ground voltage Vs is applied to the source electrode 180, the drain voltage VD is applied to the drain electrode 185, and a voltage less than or equal to the first threshold or the first turn-on voltage $V_{th1}$ is applied to the gate electrode 120, holes are accumulated enough to form a channel in the first P-type active layer 150 to activate or turn on the first P-type active layer 150. Accordingly, a current ID may flow between the source electrode 180 and the drain electrode 185.

Specifically, holes in the source electrode 180 may pass through the second P-type active layer 170, tunnel the second barrier layer 160, flow through the first P-type active layer 150, tunnel the second barrier layer 160 again, pass through the second P-type active layer 170 again, and then be provided to the drain electrode 185.

As the voltage applied to the gate electrode 120 gradually increases in the negative direction within a first gate voltage range R1, the amount of the current flowing in the first P-type active layer 150 may also increase. The ratio of the change of the current flowing through the active structure 135, that is, the change of the current between the source and drain electrodes 180 and 180 to the change of the gate voltage may provide a first slope within the first gate voltage range R1.

In this case, the second P-type active layer 170 may be in a state of inactive, that is, in a state of turn-off. This is because the electric field applied to the gate electrode 120 within the first gate voltage range R1 may be shielded by the current flowing through the first P-type active layer 150 (shielding effect) and/or reduced by the delay or voltage drop across the barrier layer 160, and therefore the actual electric field affecting the second P-type active layer 170 may be insufficient to activate the second P-type active layer 170. To this end, the barrier layer 160 may have an appropriate thickness and/or dielectric constant. The appropriate thickness of the barrier layer 160 may be affected by various parameters such as the voltage range applied to the gate electrode 120, but may be 5 to several tens nm, for example, 6 to 20 nm, 7 to 15 nm, or 8 to 12 nm.

Referring to 5, 8A, and 8B, when the voltage applied to the gate electrode 120 further increases in the negative direction, the amount of current flowing through the active structure 135, that is, the amount of current flowing between the source/drain electrodes 180 and 185 may change with a second slope less than the first slope in the first gate voltage range R1. This range will be referred to as a second gate voltage range R2, and the gate voltage when entering the second gate voltage range R2 will be referred to as a saturation voltage $V_{sat}$.

Specifically, the amount of the current flowing between the source/drain electrodes 180 and 185 within the second gate voltage range R2 may be substantially constant, that is, in one example, the second slope may be nearly zero. In the second gate voltage range R2, the second P-type active layer 170 may be in turn-off state due to the shielding effect and/or voltage drop as described above and the first P-type active layer 150 may be still in turn-on state but the amount of current flowing through the first P-type active layer 150 may be substantially saturated. That is, the second gate voltage range R2 may be understood as an intermediate voltage range in that the amount of current is maintained even when the absolute value of the gate voltage increases.

It can be understood that, because the quantized extended state or quantized conducting state with energy level lower than the mobility edge Ev in the valence band, which is generated by resonance energy matching between the crystalline region NC_R and the amorphous region AM_R, provides a limited density of state, the current flowing through the first P-type active layer 150 may be substantially saturated.

Figure 9A:
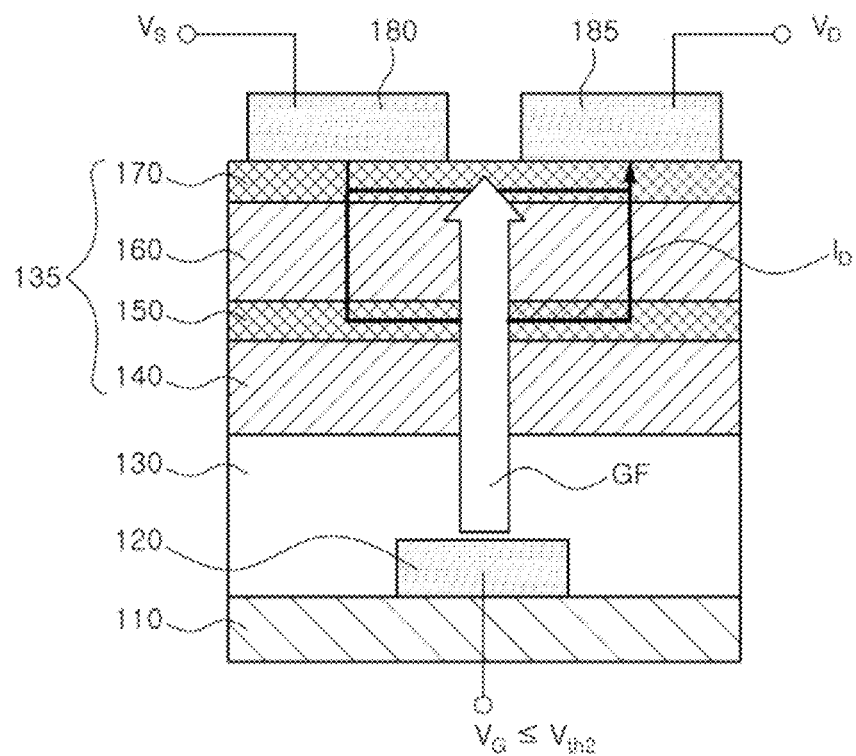
Figure 9B:
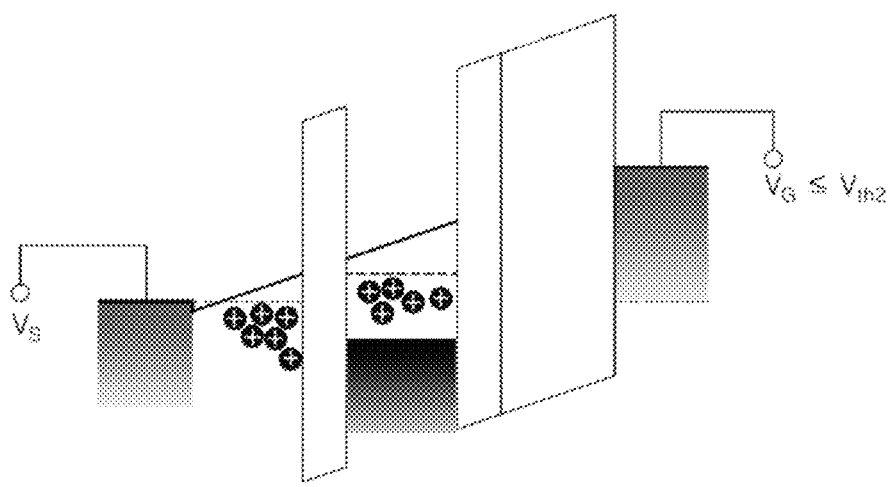

Referring to FIGS. 5, 9A, and 9B, when a voltage below or the same as a second threshold voltage or a second turn-on voltage $V_{th2}$ is applied to the gate electrode 120, the second P-type active layer 170 may also be activated, that is, turned on as holes are sufficiently accumulated in the second P-type active layer 170 to form a channel. That is, in the voltage range below the second turn-on voltage $V_{th2}$, that is, in the third gate voltage range R3, unlike the first and second gate voltage ranges R1 and R2, both the first and second P-type active layers may be in an activated states, more current may flow between the source and drain electrodes 180 and 185 than the first gate voltage range R1 or the second gate voltage range R2. As the absolute value of the gate voltage in the third gate voltage range R3 increases, the absolute value of the current flowing between the source and drain electrodes 180 and 185 may increase with a third slope. That is, the ratio of the increase in current according to the increase in the gate voltage in the third gate voltage range R3 may provide the third slope.

When the gate voltage of the third gate voltage range R3 is applied, as shown in FIG. 9A, the electric field applied to gate electrode reaches the second P-type active layer 170 by field penetration. Accordingly, the second active layer 170 may be turned on.

In summary, when the gate voltage of the first gate voltage range R1 is applied to the gate electrode 120, only the first P-type active layer 150 may be activated and the second P-type active layer 170 may not be activated. When the gate voltage of the second gate voltage range R2 larger in the negative direction than the first gate voltage range R2 is applied, the activation state of the first P-type active layer 150 may be maintained, but the amount of current may be in a saturated state. At this time, the second P-type active layer 170 may still be inactive. When the gate voltage of the third gate voltage range R3 that is larger in the negative direction than the second gate voltage range R2 is applied, both the first and second P-type active layers 150 and 170 may be activated.

Accordingly, the multilevel device according to an embodiment of the present invention may provide a multi-level conductivity as it may have a plurality of turn-on voltages. Furthermore, the multilevel device according to the embodiment of the present invention may have a second gate voltage range R2 which does not occur in the existing device, that is, a range having little or no change in the amount of the current even if the gate voltage is increased. In other words, the first turn-on voltage at the first gate voltage range R1 and the second turn-on voltage at the third gate voltage range R3 can be clearly distinguished. Therefore, even if the operating margin of the gate voltage is widened, an error occurrence rate can be reduced.

In summary, as shown in FIG. 5, the multilevel device according to the exemplary embodiment of the present invention may have a second gate voltage range R2 in which the current magnitude does not change despite a sweep of the gate voltage. That is, the second gate voltage range R2 can clearly distinguish the first gate voltage range R1 from the third gate voltage range R3. This means that the multilevel conductivity characteristic may be stably provided by the second gate voltage range R2.

Device behavior in the second gate voltage range R2, which is distinct from the first and third gate voltage ranges R1 and R2, may be because the P-type active layer has a quantized extended state with energy level below the mobility edge Ev in the valence band to exhibit a limited carrier density. In the second gate voltage range R2, there is almost no change in the amount of current flowing through the P-type active layer. It can be interpreted that this is because the maximum amount of current may flow through the P-type active layer due to the quantized extended state in the second gate voltage range R2. As described above, the multilevel device according to an exemplary embodiment may stably provide multi-conductivity characteristics in that it has a quantized conducting state under the mobility edge Ev in the valence band.

In addition, as described above, a peculiar phenomenon of quantized conducting state may be due to the film properties of the P-type active layer. That is, the quantized conducting state may be provided by hybridization by the resonance energy matching between a specific energy state AM_E among the localized energy states of the amorphous region AM_R and a specific energy state NC_E among the localized energy states of the crystalline regions NC_R. However, a method different from resonance energy matching also can provide the quantized conducting state.

Figure 10:
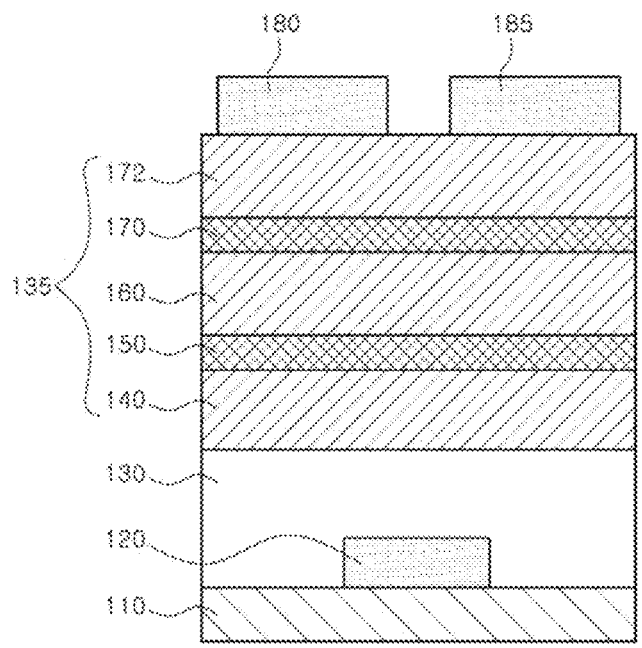
FIG. 10 is a cross-sectional view illustrating a multilevel device according to another exemplary embodiment of the present invention.
Figure 11:
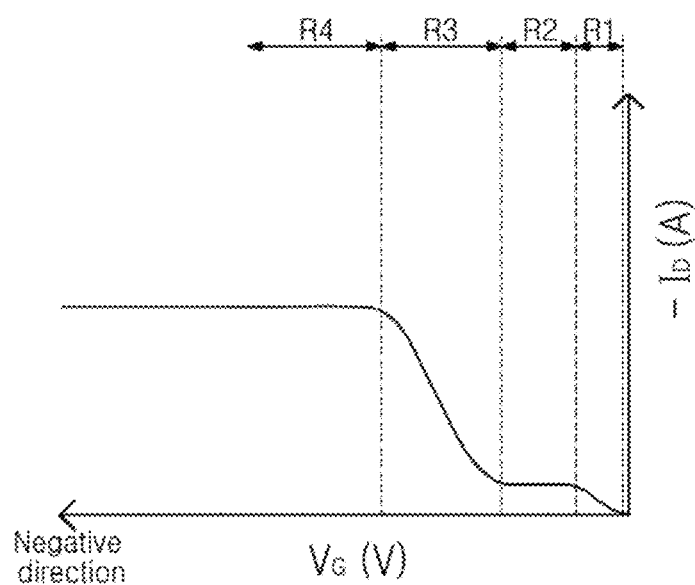
FIG. 11 is a graph illustrating a transfer characteristic of the multilevel device according to FIG. 10.

FIG. 10 is a cross-sectional view illustrating a multilevel device according to another exemplary embodiment of the present invention, and FIG. 11 is a graph illustrating a transfer characteristic of the multilevel device according to FIG. 10. Except as described later, the above description may be applied to the device according to the present embodiment.

Referring to FIGS. 10 and 11, the multilevel device may further include a third barrier layer 172 on the second P-type active layer 170. In this case, the source and drain electrodes 180 and 185 may be in contact with the third barrier layer 172. In other words, the source and drain electrodes 180 and 185 may not be in contact with the first barrier layer 140, the first P-type active layer 150, the second barrier layer 160, and the second P-type active layer 170.

Since the source and drain electrodes 180 and 185 are in contact with the third barrier layer 172, first to fourth gate voltage ranges R1 to R4 may be provided. That is, the second P-type active layer 170 may also provide a quantum well having a quantized conducting state by the second and third barrier layers 160 and 172. Accordingly, even when the gate voltage increases in the negative direction in the fourth gate voltage range R4, the current between the source and drain electrodes 180 and 185 may be kept constant.

Figure 12:
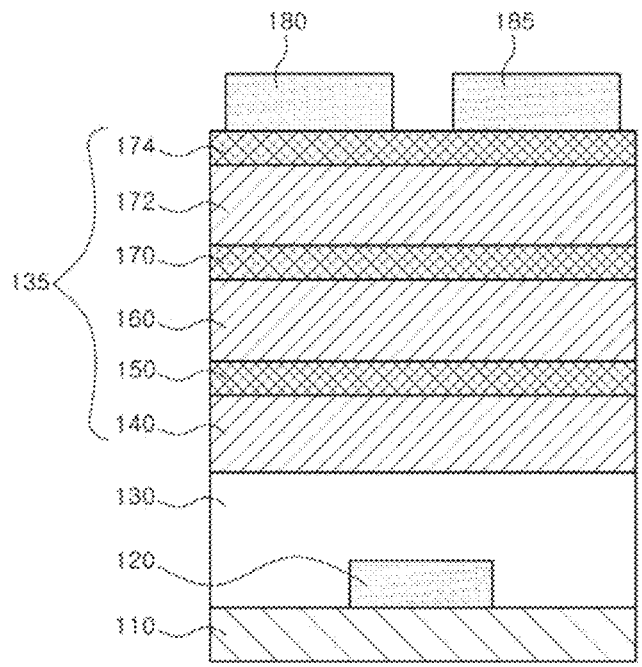
FIG. 12 is a cross-sectional view illustrating a multilevel device according to another exemplary embodiment of the present invention.
Figure 13:
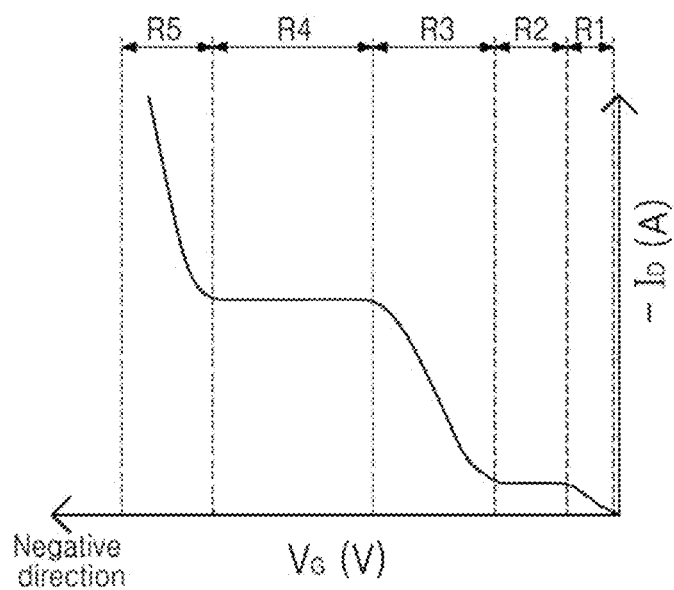
FIG. 13 is a graph illustrating a transfer characteristic of the multilevel device according to FIG. 12.

FIG. 12 is a cross-sectional view illustrating a multilevel device according to another exemplary embodiment of the present invention, and FIG. 13 is a graph illustrating a transfer characteristic of the multilevel device according to FIG. 12. Except as described later, the above description may be applied to the device according to the present embodiment.

Referring to FIGS. 12 and 13, a third P-type active layer 174 may be further provided on the third barrier layer 172. In addition, the source and drain electrodes 180 and 185 may contact the third P-type active layer 174. That is, the source and drain electrodes 180 and 185 may not be in contact with a first barrier layer 140, a first P-type active layer 150, a second barrier layer 160, a second P-type active layer 170, and a third barrier layer 172. Each of the first P-type active layer 150, the second P-type active layer 170, and further, the third P-type active layer 174, may be an active layer described with reference to FIGS. 1, 2A, 2B, 3, 4A, and 4B.

In this embodiment, since the third P-type active layer 174 is additionally provided, the first to fifth gate voltage ranges R1 to R5 may be provided. That is, in the second and fourth gate voltage ranges R2 and R4, the current flowing through the active structure 135 may be saturated due to the quantized conducting state, and the current may increase in the fifth gate voltage range R5 due to the contact between the third P-type active layer 174 and the source/drain electrodes 180 and 185.

Figure 14:
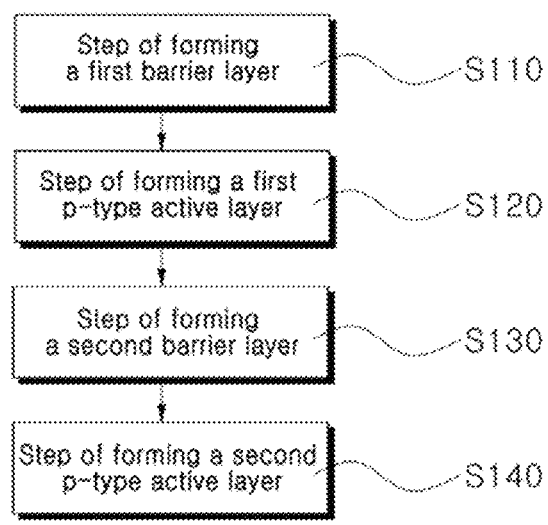
FIG. 14 is a flowchart illustrating a method of manufacturing an active structure in a method of manufacturing a multilevel device according to an embodiment of the present invention.
Figure 15:
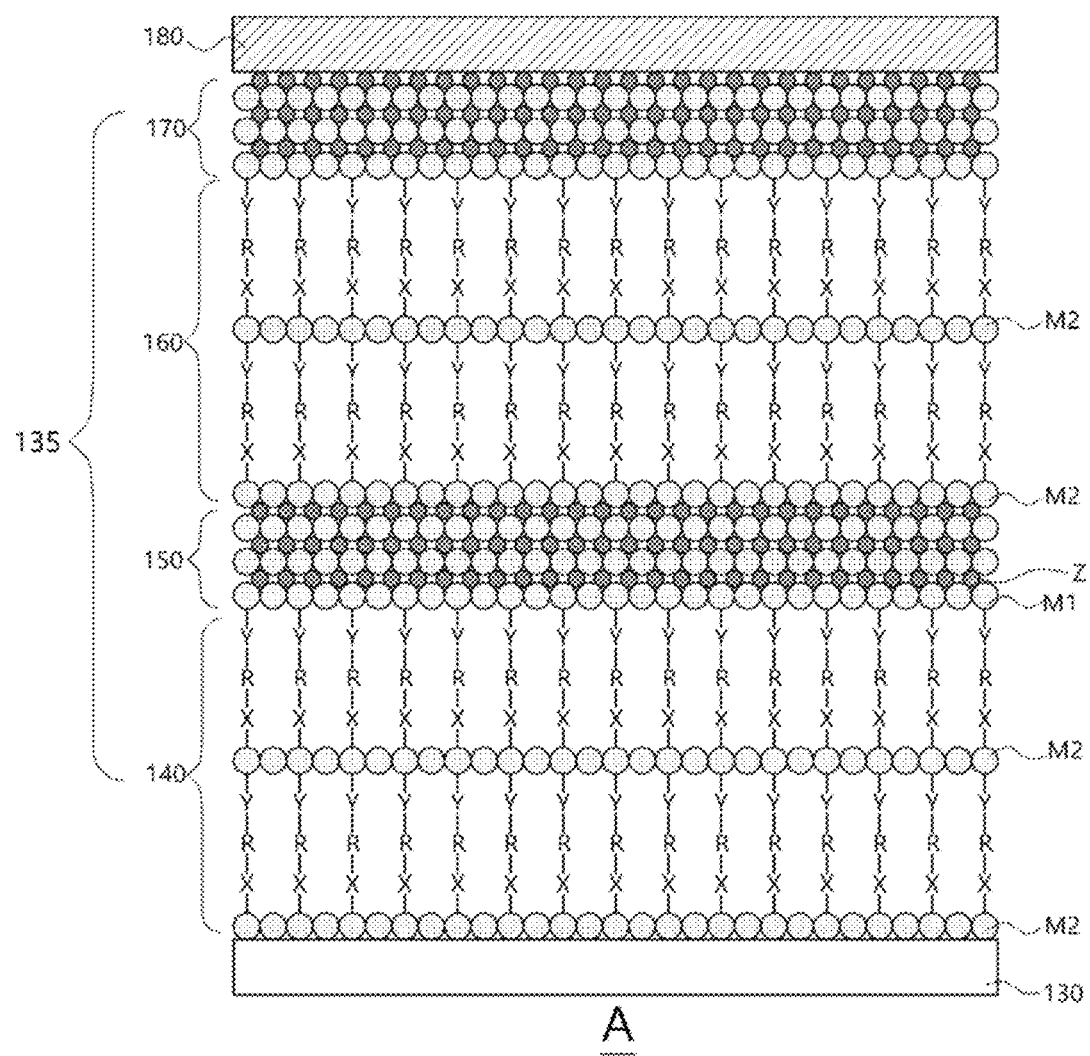
FIG. 15 is an enlarged schematic view of region A of FIG. 6A corresponding to an active structure according to an embodiment of the present invention.
Figure 16:
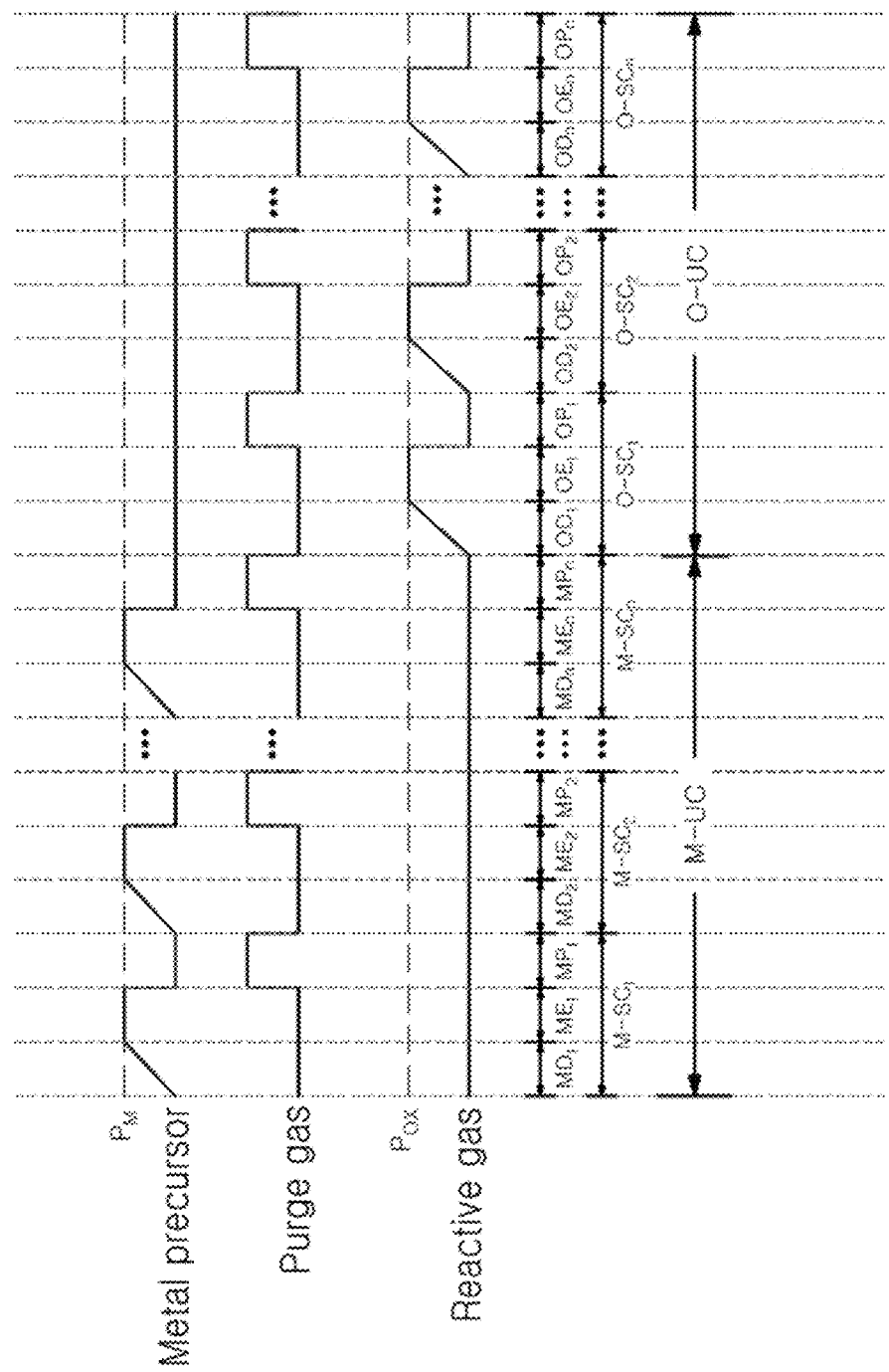
FIG. 16 is a timing diagram of metal precursor gas injection, purge gas injection, and reaction gas injection for manufacturing a P-type active layer according to an embodiment of the present invention.
Figure 17:
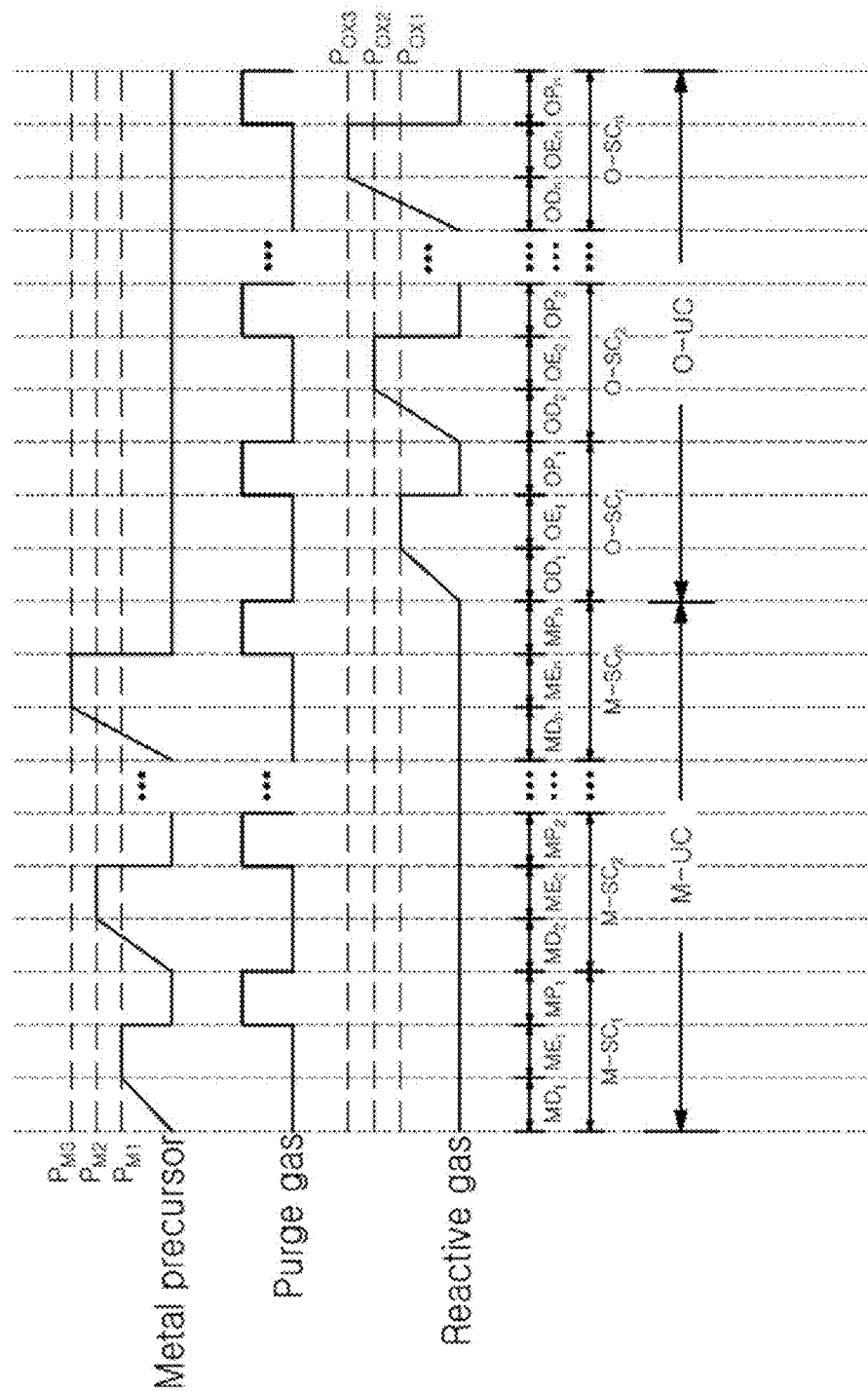
FIG. 17 is a timing diagram of metal precursor gas injection, purge gas injection, and reaction gas injection for the manufacture of a P-type active layer according to another embodiment of the present invention.

FIG. 14 is a flowchart illustrating a method of manufacturing an active structure in a method of manufacturing a multilevel device according to an embodiment of the present invention. FIG. 15 is an enlarged schematic view of region A of FIG. 6A corresponding to an active structure according to an embodiment of the present invention. FIG. 16 is a timing diagram of metal precursor gas injection, purge gas injection, and reaction gas injection for manufacturing a P-type active layer according to an embodiment of the present invention. FIG. 17 is a timing diagram of metal precursor gas injection, purge gas injection, and reaction gas injection for the manufacture of a P-type active layer according to another embodiment of the present invention.

Referring to FIGS. 1, 14, and 15, a method of manufacturing an active structure 135 in a method of manufacturing a multilevel device according to an embodiment of the present invention may include at least one of a first barrier layer forming step (S110), a P-type active layer forming step (S120), a second barrier layer forming step (S130) and a second P-type active layer forming step (S140). Each step will be described below.

First Barrier Layer Forming Step (S110)

Referring to FIGS. 1, 14, and 15, the first barrier layer 140 may be formed on the gate insulating layer 130. The first barrier layer 140 may have a larger band gap than the P-type active layer 150 to make the P-type active layer 150 a quantum well structure.

In the present exemplary embodiment, the first barrier layer 140 may include at least one organic monomer layer, and may be formed using a molecular layer deposition method. Specifically, the step for forming the first barrier layer 140 may include loading a substrate on which the gate insulating layer 130 is formed into a reaction chamber, and includes repeating a unit cycle including a metal precursor dosing step, a first purge step, an organic precursor dosing step, and a second purge step several to several tens of times. In the metal precursor dosing step, a metal precursor may be supplied into the reaction chamber for a metal M2 of the metal precursor to be chemically bonded to a surface functional group of the gate insulating layer 130 or $Y_1$ and/or $Y_2$ (Y) of an organic precursor represented by the following Chemical Formula 1. In the first purge step, a purge gas is supplied to purge the unreacted metal precursor and the reaction by-product. In the organic precursor dosing step, one or more organic precursors represented by the following Formula 1 may be supplied for $X_1$ and/or $X_2$ (X) of the organic precursor to be chemically bonded, specifically be covalently bonded, to the metal M2 of the metal precursor. In the second purge step, a purge gas may be supplied to purge the unreacted organic precursor and the reaction by-product. In FIG. 15, the unit cycle is repeated twice, but is not limited thereto. The temperature of the chamber in which the barrier layer 140 is deposited may be 90 to 120 degrees (° C.), specifically 100 to 115 degrees (° C.).

The metal precursor may be selected from the group consisting of alkyl metals, metal alkoxides, metal halides, metal hydroxides, and mixtures thereof, and may be, for example, trimethylaluminium (TMA) or diethylzinc (DEZ).

[Chemical Formula 1]

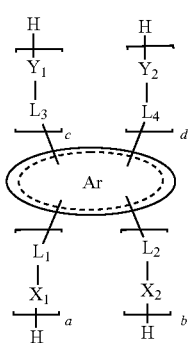

In Formula 1, $X_1$, $X_2$, $Y_1$, and $Y_2$ may be O, S, Se, NH, or PH irrespective of each other, each of a, b, c, and d may be 1 or 0, a+b may be 1 or more, c+d may be 1 or more, and Ar may be a functional group containing at least one aromatic group. When two or more aromatic groups are provided, these aromatic groups may be connected via a linking group. The aromatic group may be an aromatic hydrocarbon group of C5 to C8 or a heterocyclic aromatic group of C3 to C7. As an example, the aromatic group may be a phenyl group. $L_1$ and $L_2$ may be functional groups connecting Ar and $X_1$ and $X_2$, respectively, and $L_3$ and $L_4$ may be functional groups connecting Ar and $Y_1$ and $Y_2$, respectively. Each of $L_1$, $L_2$, $L_3$, and $L_4$ may be a bond or an alkylene group of C1 to C3. $X_1$ or $X_2$ may be more reactive functional group than $Y_1$ or $Y_2$. As one example, $X_1$ or $X_2$ may be O and $Y_1$ or $Y_2$ may be S, Se, NH, or PH.

The organic precursor represented by Chemical Formula 1 may be any one of the following compounds (18) to (34) or a combination of two or more thereof.

(18)

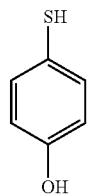

(19)

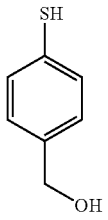

(20)

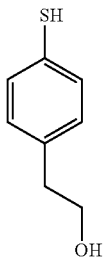

(21)

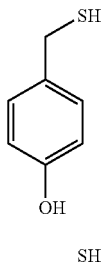

(22)

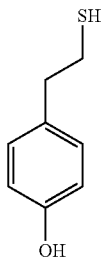

(23)

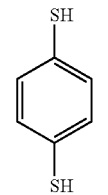

(24)

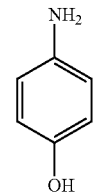

(25)

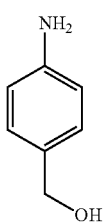

-continued

(26) 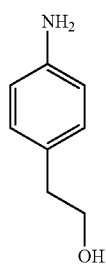

(27) 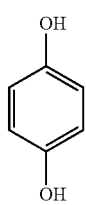

(28) 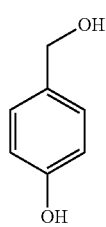

(29) 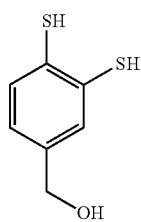

(30) 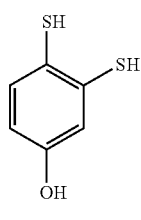

(31) 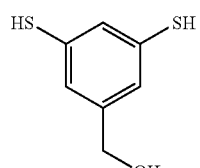

(32) 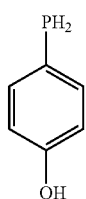

(33) 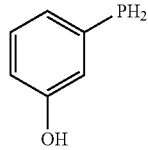

(34) 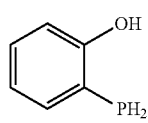

The first barrier layer 140 may have a thickness of several nm to several tens of nm.

The first barrier layer 140 formed as described above may include at least one organic monomolecular layer (X—R—Y). In addition, when the barrier layer includes two or more organic monolayers (X—R—Y), the metal atomic layer M2 may be disposed between the organic monolayers (X—R—Y). The metal atomic layer M2 may be, for example, aluminum or zinc, and the organic monomolecular layer (X—R—Y) may be represented by the following Chemical Formula 2.

[Chemical Formula 2]

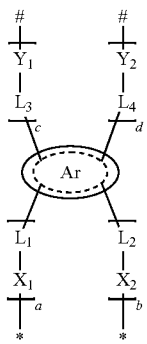

In Formula 2, Ar, $X_1$, $X_2$, $Y_1$, $Y_2$, $L_1$, $L_2$, $L_3$, $L_4$, a, b, c, and d are as defined in Formula 1. * may denote a bond with an element in the layer under the organic monomolecular layer or hydrogen, but a number of the bond with an element in the layer under the organic monomolecular layer is 1 or more. # may denote a bond with an element in the layer over the organic monomolecular layer or hydrogen, but a number of the bond with the element in the layer over the organic monomolecular layer is 1 or more. In addition, R in FIG. 15 may correspond to $(L_1)$ $(L_2)$ Ar $(L_3)$ $(L_4)$ in Chemical Formula 2.

The material represented by Formula 2 may be any one of the following compounds (1) to (17) or a combination of two or more thereof.

(1)

—S—C₆H₄—O—*

(2)

—S—C₆H₄—CH₂—O—*

(3)

—S—C₆H₄—CH₂CH₂—O—*

(4)

—CH₂—S—C₆H₄—O—*

(5)

—S—CH₂CH₂—C₆H₄—O—*

(6)

—S—C₆H₄—S—*

(7)

—NH—C₆H₄—O—*

(8)

—NH—C₆H₄—CH₂—O—*

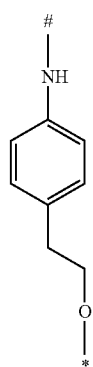 (9)
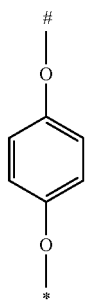 (10)
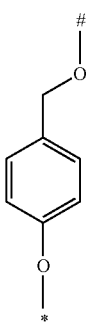 (11)
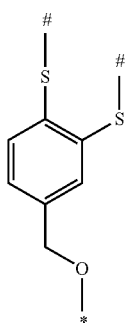 (12)
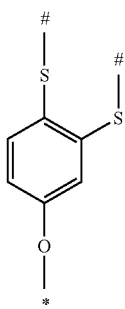 (13)
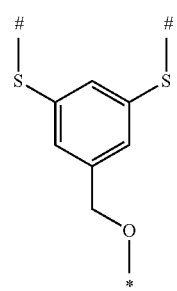 (14)
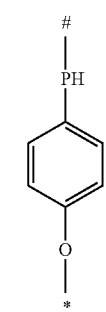 (15)
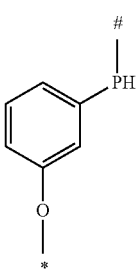 (16)
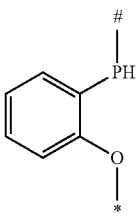 (17)
The molecules represented by Formula 2 disposed adjacent to each other in the barrier layer 140 may be stabilized by 7E-7E interaction between aromatic groups included in adjacent molecules.

The method of forming the first barrier layer 140 is not limited thereto, and the first barrier layer 140 may be an organic film, an inorganic film, or another organic/inorganic composite film.

First P-Type Active Layer Forming Step (S120)

Referring to FIGS. 1, 14, 15, 16, and 17, the method of manufacturing the first P-type active layer 150 according to an embodiment of the present invention may include repeating a unit cycle including a metal precursor unit cycle (M-UC) and a reaction gas unit cycle (O-UC) several to several hundred times. When the reaction gas is an oxidizing agent, the first P-type active layer 150 may be formed of a P-type metal oxide layer in which several to hundreds of unit layers each of which has a metal atom layer M1 and an oxygen layer Z are stacked. When the reaction gas is a sulfiding agent, the first P-type active layer 150 may be formed of a P-type metal sulfide layer in which several to hundreds of unit layers each of which has a metal atom layer M1 and a sulfur atom layer Z are stacked. When the reactant gas is a selenizing agent, the first P-type active layer 150 is a P-type metal selenide layer in which several to hundreds of unit layers each of which has a metal atom layer M1 and a selenium atom layer Z are stacked.

The metal precursor unit cycle (M-UC) may include performing a metal precursor subcycle (M-$SC_n$) including a metal precursor pressurized dosing step ($MD_n$, $ME_n$) and a metal precursor purge step ($MP_n$) at least once. The reaction gas unit cycle (O-UC) may include performing a reaction gas subcycle (M-$SC_n$) including a reaction gas pressurized dosing step ($OD_n$, $OE_n$) and a reaction gas purge step ($OP_n$) at least once. The metal precursor subcycle (M-$SC_n$) may be performed once to multiple times, specifically, 1 to 10 times (n=1 to 10), for example, 2 to 7 times (n=2 to 7), or 3 to 5 times (n=3 to 5). The reaction gas subcycle (M-SG) may be performed once to multiple times, specifically, 1 to 10 times (n=1 to 10), for example, 2 to 7 times (n=2 to 7), or 3 to 5 times (n=3 to 5).

The deposition temperature for the first P-type active layer 150 may be relatively low such as 20 to 250° C., 50 to 200° C., 80 to 150° C., 90 to 100° C., or 95 to 105° C.

Metal Precursor Pressurized Dosing Step ($MD_n$, $ME_n$)

The metal precursor pressurized dosing step may include a metal precursor supplying step $MD_1$ and a metal precursor exposing step $ME_1$. However, the metal precursor exposing step $ME_1$ may be omitted in some cases.

In the metal precursor supplying step $MD_1$, the metal precursor gas may be supplied into a chamber having a gas inlet and a gas outlet while the gas outlet of the chamber is closed. The metal precursor may be a precursor for forming a P-type metal oxide, a P-type metal sulfide, or a P-type metal selenide, and may be a Cu precursor, a Ni precursor, or a Sn precursor. Such metal precursors may be selected from the group consisting of alkylmetals, metal alkoxides, metal halides, metal hydroxides, metal-organic compounds, and mixtures thereof. In one example, the Sn precursor may be a tin-organic compound, which may be a tin (II)-organic compound or a tin (IV)-organic compound. The Sn precursor may be, for example, $(TMSA)_2Sn$ (II) (bis[bis(trimethylsily)amino]tin (II)).

The metal precursor may be supplied into the chamber at a predetermined vapor pressure, but without a carrier gas. Since the metal precursor is supplied while the gas outlet is closed, the metal precursor may be accumulated in the chamber and increase the pressure in the chamber. The metal precursor may be supplied until the pressure of the chamber reaches the reaction pressure PM (metal precursor supplying step, $MD_1$). The reaction pressure, i.e., the pressure of the metal precursor gas, may range from tens to hundreds of mTorr, specifically from 20 to 200 mTorr, from 25 to 150 mTorr, from 30 to 120 mTorr, from 35 to 100 mTorr, from 40 to 80 mTorr, or from 45 to 60 mTorr.

When the reaction pressure $P_M$ is reached, the chamber may be sealed for a predetermined time (metal precursor exposing step, $ME_1$).

In the metal precursor pressurized dosing step, that is, the metal precursor supplying step $MD_1$ and the metal precursor exposing step $ME_1$, the metal precursor gas may be deposited by chemisorption and a self-saturated reaction on the surface of the substrate or on the surface of the layer previously formed on the substrate. As the chemisorption and self-saturated reaction of the metal precursor gas proceed in a pressurized environment such as in a pressurized stagnant environment, not in a lamina flow environment, the rate of chemisorption or surface coverage on the substrate or on the surface of the layer previously formed on the substrate can be greatly improved.

Metal Precursor Purge Step ($MP_n$)

The chamber may then be purged (metal precursor purge step, $MP_1$). Specifically, the excess metal precursor gas which is not adsorbed on the surface of the substrate and the reaction byproduct produced by the reaction between the metal precursor gas and the surface of the substrate can be removed by flowing the purge gas onto the substrate surface in the chamber. In this case, the purge gas may be an inert gas, and the inert gas may include, for example, argon (Ar), nitrogen ($N_2$), or a combination thereof.

When performing the metal precursor subcycles multiple times (M-$SC_1$, ... M-$SC_n$, n≥2), in the embodiment as shown in FIG. 16, the reaction pressure $P_M$ at the metal precursor pressurized dosing steps ($MD_1$, $MD_2$, ... $MD_n$, $ME_1$, $ME_2$, ... $ME_n$, n≥2) may be substantially the same, and in the embodiment as shown in FIG. 17, the reaction pressures $P_{M1}$, $P_{M2}$, ... $P_{Mn}$ at metal precursor pressurized dosing steps ($MD_1$, $MD_2$, ... $MD_n$, $ME_1$, $ME_2$, ... $ME_n$, n≥2) may be different. In FIG. 17, the reaction pressures $P_{M1}$, $P_{M2}$, ... $P_{Mn}$ are shown to gradually increase as the number of metal precursor pressurized dosing steps ($MD_1$, $MD_2$, ... $MD_n$, $ME_1$, $ME_2$, ... $ME_n$, n≥2) increases, but are not limited thereto. As another example, the reaction pressures $P_{M1}$, $P_{M2}$, ... $P_{Mn}$ may gradually decrease.

Reaction Gas Pressurized Dosing Step ($OD_n$, $OE_n$)

The reaction gas pressurized dosing step may include a reaction gas supplying step $OD_1$ and a reaction gas exposing step $ME_1$. However, the reaction gas exposing step $ME_1$ may be omitted in some cases.

During the reaction gas supplying step $OD_1$, a reaction gas may be supplied into the chamber to react with the metal precursor adsorbed on the substrate. The reaction gas may be supplied into the chamber while the gas outlet of the chamber is closed, and the reaction gas may be supplied without a carrier gas. Since the reaction gas is supplied into the chamber while the gas outlet of the chamber is closed, the reaction gas may be accumulated in the chamber and increase the pressure in the chamber. The reaction gas may be supplied until the pressure in the chamber reaches the reaction pressure $P_{OX}$. The reaction pressure $P_{OX}$, i.e., the pressure of the reaction gas, may be in the range of 100 mTorr to several Torr, specifically 100 mTorr to 1 Torr, 150 to 500 mTorr, 200 to 400 mTorr, or 250 to 350 mTorr.

When the reaction pressure Pox is reached, the chamber may be sealed for a predetermined time (reaction gas exposing step, $OE_1$).

In the reaction gas pressurized dosing step, reaction between the reaction gas and the metal precursor may proceed in a pressurized environment such as in a pressurized stagnant environment, not in a lamina flow environment. However, the present invention is not limited thereto, and the reaction gas may be supplied in a state of a lamina flow in the chamber with the gas outlet open to react with the metal precursor.

In the reaction gas pressurized dosing step, that is, the reaction gas supplying step (OD1) and the reaction gas exposure step (OE1), the reaction gas may be an oxidizing agent, a sulfiding agent, or a selenizing agent, and the oxidizing agent may be $H_2O$, $H_2O_2$, or $O_3$ but it is not limited thereto. In one embodiment, the oxidant may be $H_2O$, the sulfiding agent may be $H_2S$, and the selenizing agent may be $H_2Se$, but is not limited thereto.

Reaction Gas Purge Step ($MP_n$)

The chamber may then be purged (reaction gas purge step, $MP_1$). Specifically, the excess reaction gas which is not react with the metal precursor layer and the reaction byproduct produced by the reaction between the reaction gas and the metal precursor can be removed by flowing the purge gas onto the substrate surface in the chamber. In this case, the purge gas may be an inert gas, and the inert gas may include, for example, argon (Ar), nitrogen ($N_2$), or a combination thereof.

When performing the reaction gas subcycles multiple times (O-$SC_1$, ... O-$SC_n$, n≥2), in the embodiment as shown in FIG. 16, the reaction pressure Pox at the reaction gas pressurized dosing steps ($OD_1$, $OD_2$, ... $OD_n$, $OE_1$, $OE_2$, ... $OE_n$, n≥2) may be substantially the same, and in the embodiment as shown in FIG. 17, the reaction pressures $P_{OX1}$, $P_{OX2}$, ... $P_{OXa}$ at reaction gas pressurized dosing steps ($OD_1$, $OD_2$, ... $OD_n$, $OE_1$, $OE_2$, ... $OE_n$, n≥2) may be different. In FIG. 17, the reaction pressures $P_{OX1}$, $P_{OX2}$, ... $P_{OXn}$ are shown to gradually increase as the number of reaction gas pressurized dosing steps ($OD_1$, $OD_2$, ... $OD_n$, $OE_1$, $OE_2$, ... $OE_n$, n≥2) increases, but are not limited thereto. As another example, the reaction pressures $P_{OX1}$, $P_{OX2}$, ... $P_{OXn}$ may gradually decrease.

When the metal precursor unit cycle M-UC and the reaction gas unit cycle O-UC are performed once, the thickness of the P-type active layer 150 may be about 0.2 to 0.5 Å specifically, 0.3 to 0.45 Å. Thereafter, the metal precursor unit cycle M-UC and the reaction gas unit cycle O-UC may be alternately repeated. The number of repetitions may determine the final thickness of the P-type active layer 150.

Since the adsorption of the metal precursor gas proceeds in a pressurized stagnant environment, the P-type active layer 150 can be formed at a thickness per unit cycle larger than a thickness per unit cycle obtained in a general ALD method, which is performed under a lamina flow environment rather than the pressurized environment. Furthermore, the surface roughness may be several Å (RMS, Root Mean Square), for example 0.1 to 0.5 nm (RMS) specifically, 0.2 to 0.3 nm (RMS) to provide excellent surface morphology.

In addition, the P-type active layer manufactured by including the metal precursor pressure dosing step, may have a crystalline region NC_R in an island shape irregularly distributed in the amorphous region or the amorphous matrix AM_R, as shown in FIGS. 2A and 2B. It may provide the quantized extended state or quantized conducting state at energy level lower than the mobility edge Ev as described with reference to FIGS. 3, 4A, and 4B.

Second Barrier Layer Forming Step (S130)

The second barrier layer 160 may be deposited on the first P-type active layer 150. The second barrier layer 160 may have a larger band gap than the first P-type active layer 150 to make the first P-type active layer 150 a quantum well structure. Since the second barrier layer 160 may be formed by the same method as described in the first barrier layer forming step S110, a detailed description thereof will be omitted. However, the present invention is not limited thereto, and the second barrier layer 160 may be an organic/inorganic composite film, an organic film or an inorganic film different from the first barrier layer 140 if the second barrier layer 160 may provide a suitable degree of voltage drop for the first P-type active layer 150 and the second P-type active layer 170 to turn on at the discrete turn-on voltages as described with reference to FIG. 5.

Second P-Type Active Layer Forming Step (S140)

The second P-type active layer 170 may be deposited on the second barrier layer 160. Since the second P-type active layer 170 may be formed by the same method as described in the first P-type active layer forming step S120, a detailed description thereof will be omitted.

Hereinafter, examples are provided to help in understanding the present invention. However, the following examples are merely provided to help in understanding of the present invention, and the present invention is not limited to the following examples.

Tin Oxide Thin Film Preparation Example

Figures 18, 19:
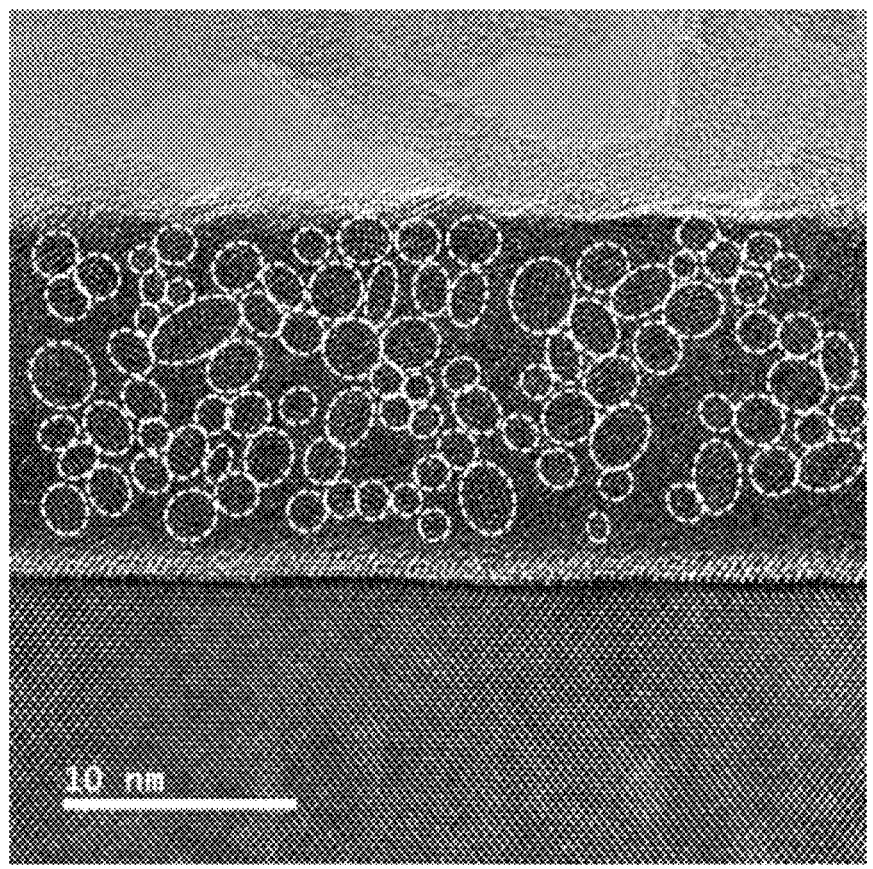
FIG. 18 is a table showing parameters of a unit cycle for preparing a tin oxide thin film according to Preparation Example.
FIG. 19 is a transmission electron microscopy (TEM) photograph of a cross section of a tin oxide thin film according to a tin oxide thin film preparation example.

FIG. 18 is a table showing parameters of a unit cycle for preparing a tin oxide thin film according to Preparation Example.

A silicon substrate was loaded into a chamber having a gas inlet and a gas outlet, and the chamber was heated to 100° C. With the gas outlet closed, a tin (II) precursor, Sn (II) (TMSA)$_2$ (bis [bis(trimethylsilyl)amino] tin (II)), was supplied onto the substrate through the gas inlet (metal precursor supplying step). The tin (II) precursor was supplied without a carrier gas until the pressure in the chamber reached 50 mTorr. Thereafter, the gas inlet of the chamber was also closed to react the tin (II) precursor with the surface of the substrate for 5 seconds while maintaining the chamber pressure at 50 mTorr (metal precursor exposing step). Subsequently, argon, which is a purge gas, was supplied through the gas inlet for 40 seconds while both the gas inlet and the gas outlet were opened (metal precursor purge step). The metal precursor supplying step, the metal precursor exposing step, and the metal precursor purge step constituted a metal precursor subcycle, and the metal precursor subcycle was repeated four times to form a tin atomic layer.

Thereafter, while the gas outlet was closed, $H_2O$ as an oxidant was supplied onto the tin atomic layer through the gas inlet. The oxidant was supplied without a carrier gas until the pressure in the chamber reached 300 mTorr (reaction gas supplying step). Thereafter, the gas inlet of the chamber was also closed to allow $H_2O$ to react with the surface of the tin atomic layer for 2 seconds while maintaining the chamber pressure at 300 mTorr (reaction gas exposing step). Thereafter, argon, a purge gas, was supplied through the gas inlet for 40 seconds while both the gas inlet and the gas outlet were opened to purge the reaction byproduct and the remaining reaction gas (reaction gas purge step). The reaction gas supplying step, the reaction gas exposing step, and the reaction gas purge step constituted an reaction gas subcycle, and the reaction gas subcycle was repeated four times to form an oxygen atom layer on the tin atomic layer. As a result, a tin oxide unit layer was formed.

The four metal precursor subcycles and the four reaction gas subcycles constitute a unit cycle for tin oxide thin film preparation. The tin oxide thin film was grown at 0.4 Å/unit cycle.

FIG. 19 is a transmission electron microscopy (TEM) photograph of a cross section of a tin oxide thin film according to a tin oxide thin film preparation example. The tin oxide thin film has a thickness of about 14 nm obtained by performing 350 unit cycles described in the tin oxide thin film manufacturing example.

Referring to FIG. 19, it can be seen that the tin oxide (SnO) thin film includes crystal grains dispersed in an amorphous matrix. The crystal grains have different crystal directions and each have a diameter of about a few nm, for example, 1 to 2 nm.

Multilevel Element Preparation Example

A 300 nm thick silicon wafer was prepared as a substrate, and a 70 nm thick aluminum gate electrode was deposited on the silicon wafer using a thermal evaporation method using a shadow mask.

An $Al_2O_3$ layer serving as a gate insulating layer was formed on the gate electrode by using the ALD (atomic layer deposition) method. Specifically, the $Al_2O_3$ layer was formed by repeating ALD unit cycle including supplying a mixed gas of trimethylaluminum (TMA) (Aldrich, 97%) as an aluminum precursor and argon as a carrier gas, and supplying argon as a purge gas, supplying a mixed gas of $H_2O$ as an oxidant and argon as a carrier gas, and supplying argon as a purge gas.

A first barrier layer was deposited on the $Al_2O_3$ layer, which is the gate insulating layer. The first barrier layer was formed by performing 20 unit cycles each of which includes providing a mixed gas of TMA source gas and argon at a temperature of 20° C. for 2 seconds, providing an argon purge gas for 20 seconds, providing a mixed gas of 4MP ((4-mercaptophenol), which is an organic precursor, and argon, which is a carrier gas, for 20 seconds at a temperature of 75° C., and providing argon purge gas for 200 seconds. The first barrier layer was an Al-4MP layer having a thickness of about 10 nm.

A first active layer was deposited on the first barrier layer. To this end, the unit cycle according to the tin oxide thin film preparation example was performed 225 times to form a SnO thin film having a thickness of about 9 nm.

Thereafter, after a second barrier layer was formed in the same manner as the first barrier layer forming method, a second active layer was formed on the second barrier layer by the same method as the first active layer forming method.

Afterwards, aluminum patterns having a thickness of 70 nm were formed by using thermal evaporation using a shadow mask to form source and drain electrodes.

Figure 20A:
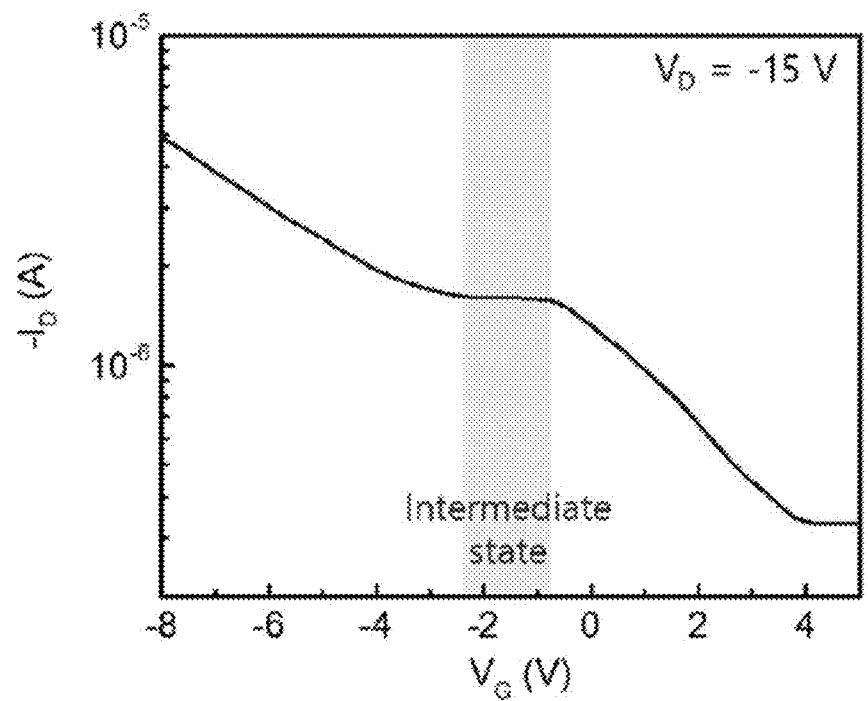
FIGS. 20A and 20B are graphs showing transfer characteristics of a multilevel device manufactured according to a multilevel device manufacturing example.
Figure 20B:
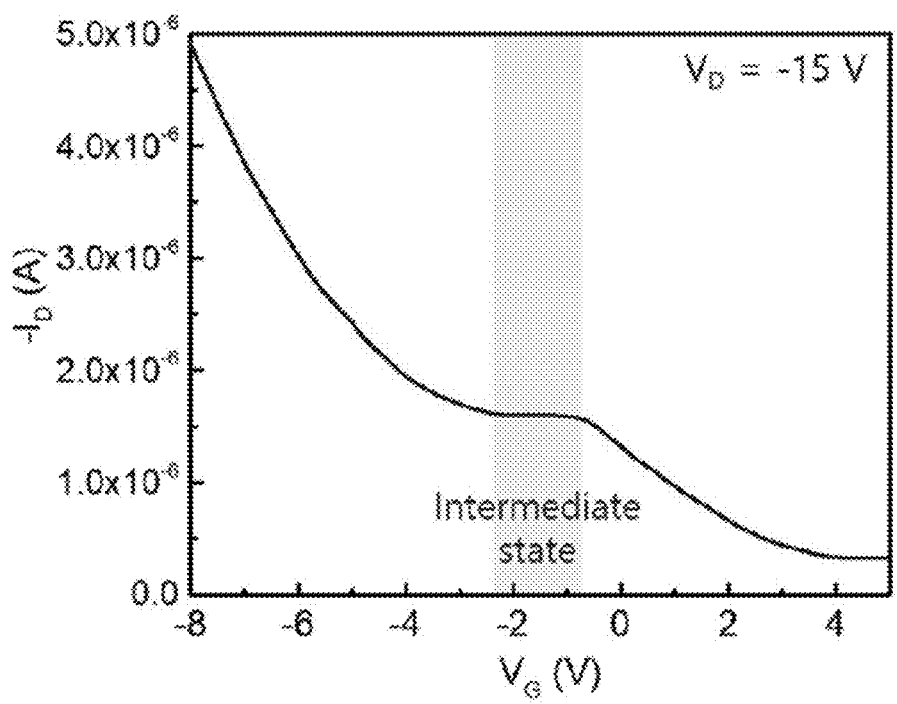

FIGS. 20A and 20B are graphs showing transfer characteristics of a multilevel device manufactured according to a multilevel device manufacturing example.

Referring to FIGS. 20A and 20B, the manufactured multilevel device has different transfer characteristics in the first to third gate voltage ranges R1 to R3 as described with reference to FIG. 5. The first threshold voltage $V_{TH1}$ was found to be about 3V, the saturation voltage $V_{sat}$ was found to be about −0.8V, and the second threshold voltage $V_{TH2}$ was found to be about −2.2V. Thus, the intermediate voltage range, i.e., the second gate voltage range, exhibiting a substantially constant current magnitude was identified as the region between about −0.8V and −2.2V.

As described above, according to the exemplary embodiment of the present invention, the P-type multilevel device may have a plurality of turn-on voltages, thereby providing multilevel conductivity.

Furthermore, the multilevel device according to the exemplary embodiment of the present invention may have a gate voltage range that does not occur in the existing device, that is, a range having little or no change in the magnitude of current even when the gate voltage is increased.

While the exemplary embodiments of the present invention have been described above, those of ordinary skill in the art should understood that various changes, substitutions and alterations may be made herein without departing from the spirit and scope of the present invention as defined by the following claims.

What is claimed is:

1. A P-type multilevel element comprising:
   a gate electrode;
   an active structure overlapping the gate electrode and having a first P-type active layer, a second P-type active layer, and a barrier layer disposed between the first P-type active layer and the second P-type active layer;
   a gate insulating layer disposed between the gate electrode and the active structure; and
   source and drain electrodes electrically connected to both ends of the active structure, respectively,
   wherein a threshold voltage for forming a channel in the first P-type active layer and a threshold voltage for forming a channel in the second P-type active layer have different values, and
   wherein at least one of the first P-type active layer and the second P-type active layer has a plurality of crystal grains dispersed in an amorphous matrix.

2. The P-type multilevel element of claim 1, wherein at least one of the first P-type active layer and the second P-type active layer has a thickness of several to several tens of nm.

3. The P-type multilevel element of claim 1, wherein the crystal grains have an average diameter of several nm.

4. The P-type multilevel element of claim 1, wherein the current flowing in the first P-type active layer is saturated after the channel is formed in the first P-type active layer and before the channel is formed in the second P-type active layer.

5. The P-type multilevel element of claim 1, wherein a gate voltage applied to the gate electrode has a first gate voltage range, a second gate voltage range, and a third gate voltage range, and
   a ratio of the current flowing through the active structure to the gate voltage has a first slope in the first gate voltage range, a second slope lower than the first slope in the second gate voltage range, and a third slope greater than the second slope in the third gate voltage range.

6. The P-type multilevel element of claim 5, wherein the second slope is 0.

7. The P-type multilevel element of claim 1, wherein the barrier layer is a first barrier layer, the active structure further includes a second barrier layer disposed between the gate insulating layer and the first P-type active layer, and the first P-type active layer interposed between the first barrier layer and the second barrier layer forms a quantum well.

8. The P-type multilevel element of claim 1, wherein the barrier layer comprises two or more organic monolayers, and a metal atomic layer disposed between the adjacent organic monolayers.

9. The P-type multilevel element of claim 1, wherein
   some of the energy states of the amorphous region and some of the energy states of the crystalline region are matched to provide a quantized conducting state at energy level lower than a mobility edge in a valence band.

10. A method for manufacturing a P-type multilevel element of claim 1, comprising:

a step for forming a gate electrode, a step for forming an active structure, a step for forming a gate insulating layer, and a step for forming a source/drain electrodes electrically connected to both ends of the active structure, wherein the step for forming the active structure includes a step for forming a first P-type active layer, a step for forming a barrier layer on the first P-type active layer, and a step for forming a second P-type active layer on the barrier layer, and at least one of steps for forming the first P-type active layer and the second P-type active layer includes performing a plurality of unit cycles each including a metal precursor pressurized dosing step in which a metal precursor is supplied while a gas outlet of a chamber is closed to increase a reaction pressure in the chamber to adsorb the metal precursor onto a surface of the substrate; a metal precursor purge step of purging the chamber after the metal precursor pressurized dosing step; a reaction gas supplying step of supplying a reaction gas into the chamber after the metal precursor purge step to react the reaction gas with the metal precursor adsorbed on the surface of the substrate; and a reaction gas purge step of purging the chamber after the reaction gas supplying step.

11. The method of claim 10, wherein the metal precursor pressurized dosing step and the metal precursor purge step constitute a metal precursor subcycle, the metal precursor subcycle is performed multiple times before the reaction gas supplying step.

12. The method of claim 10, wherein the reaction gas supplying step is a reaction gas pressurized dosing step including supplying the reaction gas into the chamber while the gas outlet of the chamber is closed to increase a pressure in the chamber.

13. The method of claim 12, wherein the reaction gas pressurized dosing step and the reaction gas purge step constitute an reaction gas subcycle, and the unit cycle includes performing the reaction gas subcycle several times in succession.

14. The method of claim 10, wherein the barrier layer includes at least one organic monolayer.

15. The method of claim 10, wherein the barrier layer comprises two or more organic monolayers, and a metal atomic layer disposed between the adjacent organic monolayers.

16. A P-type multilevel element comprising:
a gate electrode;
an active structure overlapping the gate electrode and having a first P-type active layer, a second P-type active layer, and a barrier layer disposed between the first P-type active layer and the second P-type active layer;
a gate insulating layer disposed between the gate electrode and the active structure; and
source and drain electrodes electrically connected to both ends of the active structure, respectively,
wherein a threshold voltage for forming a channel in the first P-type active layer and a threshold voltage for forming a channel in the second P-type active layer have different values, and
wherein the first P-type active layer and the second P-type active layer are each independently a metal oxide semiconductor layer, a metal sulfide semiconductor layer, or a metal selenide semiconductor layer.

17. The P-type multilevel element of claim 16, wherein the first P-type active layer and the second P-type active layer are each independently a copper (I) oxide layer, a tin (II) oxide layer, or a nickel (II) oxide layer.

18. A P-type multilevel element comprising:
a gate electrode;
an active structure overlapping the gate electrode and having a first P-type active layer, a second P-type active layer, and a barrier layer disposed between the first P-type active layer and the second P-type active layer;
a gate insulating layer disposed between the gate electrode and the active structure; and
source and drain electrodes electrically connected to both ends of the active structure, respectively,
wherein a threshold voltage for forming a channel in the first P-type active layer and a threshold voltage for forming a channel in the second P-type active layer have different values, and
wherein the barrier layer includes at least one organic monolayer.

19. A P-type semiconductor layer which exhibits a first energy range providing extended states at a first number of state and a second energy range providing extended states at a second number of state at an energy level lower than the mobility edge in the valence band,
wherein the first energy range and the second energy range do not overlap each other, and
wherein at least one of the first P-type active layer and the second P-type active layer has a plurality of crystal grains dispersed in an amorphous matrix.

20. The P-type semiconductor layer of claim 19, wherein a localized state is provided between the first energy range and the second energy range.

21. The P-type semiconductor layer of claim 20, wherein, in the localized state, a density of state is 0.

22. The P-type semiconductor layer of claim 19, wherein a first density of state curve in the first energy range and a second density of state curve in the second energy range are discontinuous with each other.

23. The P-type semiconductor layer of claim 19, wherein a lowest energy value of the first energy range is greater than a maximum energy value of the second energy range.

* * * * *